US011152762B2

(12) United States Patent
Kaji et al.

(10) Patent No.: US 11,152,762 B2
(45) Date of Patent: Oct. 19, 2021

(54) SEMICONDUCTOR LASER DEVICE, CHIP ON SUBMOUNT, AND SEMICONDUCTOR LASER MODULE

(71) Applicant: FURUKAWA ELECTRIC CO., LTD., Tokyo (JP)

(72) Inventors: Eisaku Kaji, Tokyo (JP); Yutaka Ohki, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/027,938

(22) Filed: Jul. 5, 2018

(65) Prior Publication Data
US 2018/0323579 A1 Nov. 8, 2018

Related U.S. Application Data

(63) Continuation of application No. PCT/JP2017/001023, filed on Jan. 13, 2017.
(Continued)

(51) Int. Cl.
*H01S 5/10* (2006.01)
*H01S 5/22* (2006.01)
(Continued)

(52) U.S. Cl.
CPC .......... *H01S 5/1014* (2013.01); *G02B 6/2938* (2013.01); *G02B 6/29362* (2013.01);
(Continued)

(58) Field of Classification Search
CPC .... G02B 6/29362; G02B 6/2938; G02B 6/32; G02B 6/34; G02B 6/4206; G02B 6/4215;
(Continued)

(56) References Cited

U.S. PATENT DOCUMENTS 4,349,905 A * 9/1982 Ackley ............... H01S 5/10
372/46.01
5,319,528 A * 6/1994 Raven ............... G02B 27/09
359/318
(Continued)

FOREIGN PATENT DOCUMENTS

GB 2 283 858 5/1995
JP 60-125412 U 8/1985
(Continued)

OTHER PUBLICATIONS

International Search Report dated Mar. 21, 2017 in PCT/JP2017/001023 filed Jan. 13, 2017 (with English Translation).
(Continued)

*Primary Examiner* — Peter Radkowski
(74) *Attorney, Agent, or Firm* — Oblon, McClelland, Maier & Neustadt, L.L.P.

(57) ABSTRACT

A semiconductor laser device of an edge emission type, where a waveguide mode is multi-mode, is provided. The semiconductor laser device includes a first facet of the waveguide on an emission direction front side, the first facet having a first width in a horizontal direction perpendicular to a longitudinal direction of the waveguide; and a second facet of the waveguide on an emission direction rear side, the second facet having the first width, wherein a width of the waveguide, in the horizontal direction, is at least partially narrower than the first width, between the first facet and the second facet.

20 Claims, 9 Drawing Sheets

Related U.S. Application Data

(60) Provisional application No. 62/278,234, filed on Jan. 13, 2016.

(51) Int. Cl.
*H01S 5/042* (2006.01)
*H01S 5/023* (2021.01)
*H01S 5/0233* (2021.01)
*H01S 5/0235* (2021.01)
*G02B 6/293* (2006.01)
*G02B 6/32* (2006.01)
*G02B 6/34* (2006.01)
*G02B 6/42* (2006.01)

(52) U.S. Cl.
CPC ............... *G02B 6/32* (2013.01); *G02B 6/34* (2013.01); *G02B 6/4206* (2013.01); *G02B 6/4215* (2013.01); *H01S 5/023* (2021.01); *H01S 5/0233* (2021.01); *H01S 5/0235* (2021.01); *H01S 5/0421* (2013.01); *H01S 5/04254* (2019.08); *H01S 5/1039* (2013.01); *H01S 5/22* (2013.01); *H01S 5/04256* (2019.08)

(58) Field of Classification Search
CPC .. H01S 5/02236; H01S 5/0421; H01S 5/1014; H01S 5/1039; H01S 5/22
See application file for complete search history.

(56) References Cited

U.S. PATENT DOCUMENTS

| | | | | |
|---|---|---|---|---|
| 5,675,597 | A * | 10/1997 | Shigihara | H01S 5/02296 372/109 |
| 5,790,729 | A * | 8/1998 | Pologe | G02B 6/125 385/20 |
| 6,124,973 | A * | 9/2000 | Du | G02B 27/09 359/618 |
| 6,198,864 | B1 * | 3/2001 | Lemoff | G02B 6/29367 385/24 |
| 6,330,265 | B1 * | 12/2001 | Kinoshita | G02B 6/12007 372/50.12 |
| 6,396,978 | B1 * | 5/2002 | Grann | G02B 6/29358 385/24 |
| 6,476,379 | B2 * | 11/2002 | Ando | G02B 6/4201 250/227.11 |
| 6,810,054 | B2 * | 10/2004 | Sousa | H01S 5/2231 372/45.01 |
| 6,882,670 | B2 * | 4/2005 | Buda | H01S 5/22 372/46.01 |
| 6,928,097 | B2 * | 8/2005 | Chida | H01S 5/227 372/46.01 |
| 6,993,053 | B2 * | 1/2006 | Buda | H01S 5/04252 372/44.01 |
| 7,474,682 | B2 * | 1/2009 | Mizuuchi | H01S 5/0625 372/46.01 |
| 7,496,127 | B2 * | 2/2009 | Matsuda | B82Y 20/00 372/102 |
| 7,738,523 | B2 * | 6/2010 | Hatori | B82Y 20/00 372/45.01 |
| 7,773,655 | B2 * | 8/2010 | Chuyanov | G02B 6/4206 372/50.23 |
| 7,949,031 | B2 * | 5/2011 | Shchukin | H01S 5/10 372/92 |
| 7,995,625 | B2 * | 8/2011 | Leem | H01S 5/026 372/19 |
| 8,396,091 | B2 * | 3/2013 | Kalosha | H01S 5/1003 372/102 |
| 8,427,749 | B2 * | 4/2013 | Du | H01S 5/4012 359/618 |
| 8,437,086 | B2 * | 5/2013 | Du | H01S 5/405 359/618 |
| 8,537,869 | B2 * | 9/2013 | Crump | H01S 5/2036 372/45.01 |
| 8,675,705 | B2 * | 3/2014 | Erbert | H01S 5/1064 372/102 |
| 8,711,894 | B2 * | 4/2014 | Chuyanov | G02B 6/4206 372/23 |
| 8,971,368 | B1 * | 3/2015 | Raring | H01S 5/34333 372/44.011 |
| 9,042,731 | B2 * | 5/2015 | Kurokawa | H04J 14/02 398/91 |
| 9,048,631 | B2 * | 6/2015 | Eichler | B82Y 20/00 |
| 9,136,671 | B2 * | 9/2015 | Lauer | H01S 5/0655 |
| 9,166,369 | B2 * | 10/2015 | Kanskar | H01S 5/1003 |
| 9,166,373 | B1 * | 10/2015 | Raring | H01S 5/3013 |
| 9,214,786 | B2 * | 12/2015 | Hemenway | H01S 5/2036 |
| 9,559,494 | B2 * | 1/2017 | Lauer | H01S 5/323 |
| 9,627,852 | B2 * | 4/2017 | Hemenway | H01S 5/2036 |
| 9,722,394 | B2 * | 8/2017 | Lauer | H01S 5/10 |
| 10,063,030 | B2 * | 8/2018 | Hemenway | H01S 5/1014 |
| 10,069,280 | B2 * | 9/2018 | Kinugawa | H01S 5/0421 |
| 2001/0023920 | A1 * | 9/2001 | Ando | G02B 6/4245 250/227.11 |
| 2002/0085604 | A1 * | 7/2002 | Sousa | H01S 5/2231 372/46.01 |
| 2003/0057427 | A1 * | 3/2003 | Chida | H01S 5/227 257/98 |
| 2004/0013147 | A1 * | 1/2004 | Buda | B82Y 20/00 372/45.01 |
| 2004/0028104 | A1 * | 2/2004 | Buda | H01S 5/04252 372/46.01 |
| 2007/0133648 | A1 * | 6/2007 | Matsuda | H01S 5/12 372/102 |
| 2007/0165685 | A1 * | 7/2007 | Mizuuchi | H01S 5/0625 372/38.05 |
| 2007/0248134 | A1 * | 10/2007 | Hatori | H01S 5/12 372/45.01 |
| 2009/0116525 | A1 * | 5/2009 | Shchukin | H01S 5/10 372/45.01 |
| 2009/0323752 | A1 * | 12/2009 | Chuyanov | G02B 6/4206 372/50.12 |
| 2010/0142579 | A1 * | 6/2010 | Leem | H01S 5/026 372/50.11 |
| 2010/0226405 | A1 * | 9/2010 | Chuyanov | G02B 6/4206 372/50.12 |
| 2012/0002293 | A1 * | 1/2012 | Du | H01S 5/4012 359/629 |
| 2012/0148192 | A1 * | 6/2012 | Nakanishi | G02B 6/4206 385/33 |
| 2012/0177077 | A1 * | 7/2012 | Erbert | H01S 5/2036 372/50.11 |
| 2012/0195335 | A1 * | 8/2012 | Kalosha | H01S 5/1003 372/45.01 |
| 2012/0287957 | A1 * | 11/2012 | Crump | H01S 5/2036 372/45.01 |
| 2013/0089115 | A1 * | 4/2013 | Kanskar | H01S 5/1014 372/45.01 |
| 2013/0148966 | A1 * | 6/2013 | Kurokawa | H04J 14/02 398/65 |
| 2014/0064311 | A1 * | 3/2014 | Eichler | H01S 5/2218 372/45.01 |
| 2014/0301421 | A1 * | 10/2014 | Kanskar | H01S 5/0287 372/46.01 |
| 2014/0334508 | A1 * | 11/2014 | Lauer | H01S 5/024 372/36 |
| 2015/0295386 | A1 * | 10/2015 | Hemenway | H01S 5/187 372/46.01 |
| 2015/0346433 | A1 * | 12/2015 | Tamura | H04B 10/506 398/82 |
| 2015/0349495 | A1 * | 12/2015 | Kinugawa | H01S 5/162 438/31 |
| 2016/0172823 | A1 * | 6/2016 | Hemenway | H01S 5/2036 372/46.01 |
| 2017/0288364 | A1 * | 10/2017 | Hemenway | H01S 5/187 |

(56) References Cited

U.S. PATENT DOCUMENTS

2017/0310081 A1\* 10/2017 Lauer ................ H01S 5/024
2019/0058305 A1\* 2/2019 Hemenway ........... H01S 5/2036

FOREIGN PATENT DOCUMENTS

| | | |
|---|---|---|
| JP | 61-051770 | 4/1986 |
| JP | 01-273378 | 11/1989 |
| JP | 2001-288456 | 10/2001 |
| JP | 2003-31906 | 1/2003 |
| JP | 2003-101139 | 4/2003 |
| JP | 2008-021905 | 1/2008 |
| JP | 2009-021506 | 1/2009 |
| JP | 2009-164389 | 7/2009 |
| JP | 2011-77471 | 4/2011 |
| JP | 2011-151238 | 8/2011 |
| JP | 2015-502051 A | 1/2015 |
| JP | 2016-122705 A | 7/2016 |
| WO | WO 95/013639 | 5/1995 |

OTHER PUBLICATIONS

Written Opinion dated Mar. 21, 2017 in PCT/JP2017/001023 filed Jan. 13, 2017.
Japanese Office Action dated Nov. 4, 2020 in Japanese Patent Application No. 2017-561185 (with unedited computer generated English translation), citing documents AO through AQ therein, 9 pages.
Japanese Office Action dated Jul. 6, 2021 in Japanese Patent Application No. 2017-561185 (with Computer Generated English Translation).

\* cited by examiner

SEMICONDUCTOR LASER DEVICE, CHIP ON SUBMOUNT, AND SEMICONDUCTOR LASER MODULE

CROSS-REFERENCE TO RELATED APPLICATION(S)

This application is a continuation of International Application No. PCT/JP2017/001023, filed on Jan. 13, 2017 which claims the benefit of priority of U.S. Provisional Application No. 62/278,234, filed on Jan. 13, 2016, the entire contents of which are incorporated herein by reference.

BACKGROUND

1. Field of the Disclosure

The present disclosure relates to a semiconductor laser device, a chip on submount, and a semiconductor laser module.

2. Description of the Related Art

Semiconductor laser devices are widely used as laser light sources in optical communication applications, industry processing applications and the like. In the optical communication applications, laser light has to be propagated over a long distance (such as several hundreds of kilometers) through an optical fiber, and single-mode laser light is generally used to prevent deterioration of the quality of an optical signal. On the other hand, in the industry processing applications, high power is required compared to the case of laser light for the optical communication applications, but propagation over a long distance is not necessary, and thus multi-mode laser light, which is advantageous for high power, is generally used. An edge emission type semiconductor laser device, which emits the multi-mode laser light, adopts a configuration in which a waveguide is wide, thereby allowing for lasing in a plurality of modes in the waveguide.

The edge emission type semiconductor laser device, which emits multi-mode laser light, involves a task of reducing a radiation angle of the laser light radiated from a facet.

Increasing a waveguide width at an emission direction front facet of a multi-mode semiconductor laser reduces optical density at the front facet, and is thus desirable from the standpoint of reducing damage to the facet. However, if the waveguide width is excessively increased, optical coupling efficiency to a multi-mode fiber is reduced. To maintain constant optical coupling efficiency, a product of the waveguide width and the radiation angle has to be maintained constant. That is, a smaller radiation angle is necessary to realize a wider waveguide width. With a single-mode semiconductor laser, limitation is imposed on the waveguide width to maintain single mode property, and thus, it is difficult to greatly increase the waveguide width such that reliability is noticeably improved.

Light from the multi-mode semiconductor laser is generally used by being coupled into a multi-mode fiber. As will be described later, radiated light from a plurality of multi-mode semiconductor lasers may be collectively coupled into the multi-mode fiber. When the radiation angle of the multi-mode semiconductor lasers is small, radiated light from a large number of multi-mode semiconductor lasers may be coupled. This is desirable because optical output of one multi-mode fiber is increased.

With respect to this point, a method of providing an anti-waveguiding layer outside a waveguide stripe to thereby suppress a higher order mode and reduce the radiation angle is known (for example, see U.S. Pat. No. 8,537,869).

SUMMARY

The present disclosure has been made in view of the above circumstances, and is directed to a semiconductor laser device wherein a radiation angle of laser light radiated from a facet may be reduced.

According to an aspect of the present disclosure, a semiconductor laser device of an edge emission type, where a waveguide mode is multi-mode is provided. The semiconductor laser device includes a first facet of the waveguide on an emission direction front side, the first facet having a first width in a horizontal direction perpendicular to a longitudinal direction of the waveguide; and a second facet of the waveguide on an emission direction rear side, the second facet having the first width. The waveguide, in the horizontal direction, is at least partially narrower than the first width, between the first facet and the second facet.

According to another aspect of the present disclosure, a semiconductor laser device of an edge emission type, where a waveguide mode is multi-mode is provided. The semiconductor laser device includes a first facet of the waveguide on an emission direction front side, the first facet having a first width in a horizontal direction perpendicular to a longitudinal direction of the waveguide; and a second facet of the waveguide on an emission direction rear side, the second facet having the first width; and a current injection region from which current is injected into the waveguide, the current injection region having a width, in the horizontal direction, that is at least partially narrower, between the first facet on an emission direction front side and the second facet on an emission direction rear side, than a width, in the horizontal direction, of another region of the current injection region.

According to yet another aspect of the present disclosure, a semiconductor laser device of an edge emission type, where a waveguide mode is multi-mode is provided. The semiconductor laser device includes a current injection region from which current is injected into the waveguide, the current injection region having a width narrower than the waveguide in a horizontal direction perpendicular to a longitudinal direction of the waveguide; and a coverage region having a coverage width obtained by dividing, by two, a result of subtracting the width of the current injection region from a width of the waveguide in the horizontal direction, the coverage width being at least partially wider than 5 µm and 23 µm or less, between a first facet of the waveguide on an emission direction front side and a second facet of the waveguide on an emission direction rear side.

DETAILED DESCRIPTION

Hereinafter, semiconductor laser devices and a semiconductor laser module according to embodiments of the present disclosure will be described in detail with reference to the accompanying drawings. Additionally, the present disclosure is not limited to the embodiments described below. Moreover, it should be noted that the drawings are schematic, and do not necessarily represent actual dimensional relationships, ratios and the like of the elements. Furthermore, dimensional relationships, ratios and the like may be different between the drawings.

Comparative Example

Figure 1:
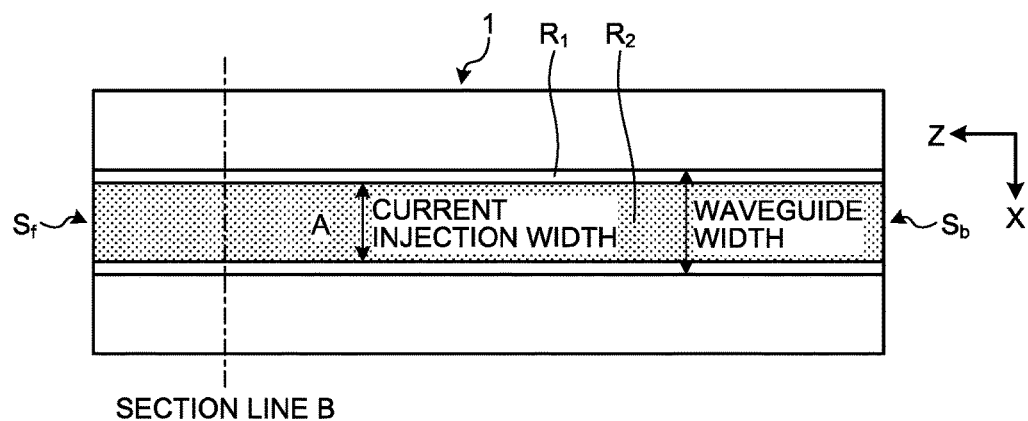
FIG. 1 is a top view schematically illustrating a configuration of a semiconductor laser device according to a comparative example.
Figure 2:
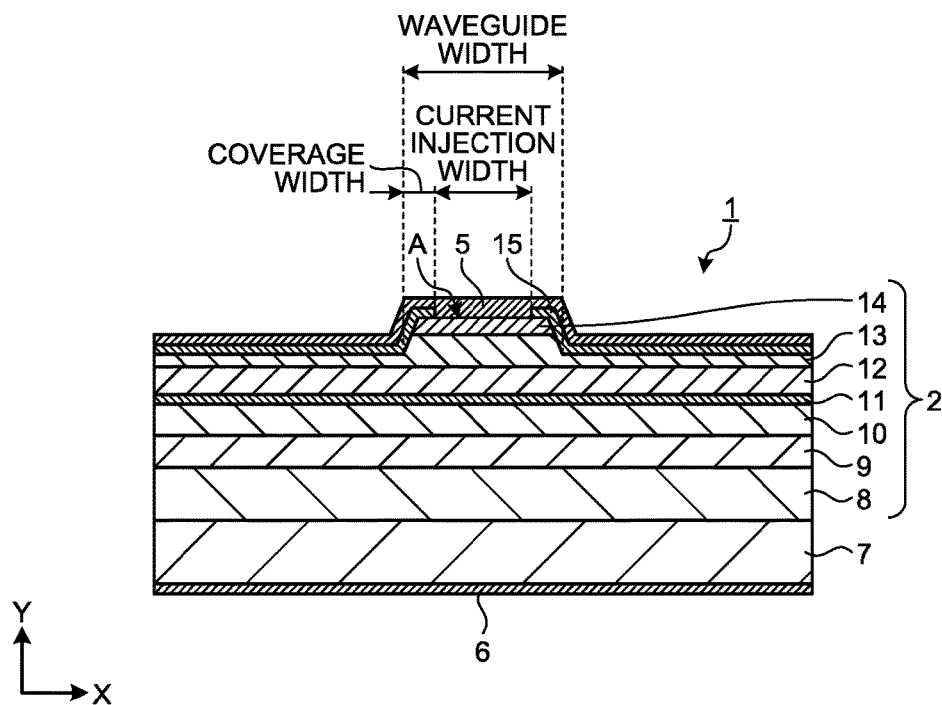
FIG. 2 is a cross-sectional view taken along a line B, schematically illustrating the configuration of the semiconductor laser device according to the comparative example.

To facilitate understanding of embodiments of the present disclosure described later, a configuration of a semiconductor laser device according to a comparative example will be described below. FIG. 1 is a top view schematically illustrating a configuration of a semiconductor laser device according to a comparative example, and FIG. 2 is a cross-sectional view taken along a line B, schematically illustrating the configuration of the semiconductor laser device according to the comparative example. A general configuration and definition of terms regarding the semiconductor laser device described with reference to FIGS. 1 and 2 will be used for semiconductor laser devices according to embodiments of the present disclosure described later without special notice.

As illustrated in FIG. 1, a semiconductor laser device 1 according to the comparative example is an edge emission type semiconductor laser device. In this laser device, an emission direction front facet $S_f$ and an emission direction rear facet $S_b$ form a resonator. Here, an emission direction front side is a positive direction on a Z-axis in the drawing, and an emission direction rear side is a negative direction on the Z-axis in the drawing. Furthermore, a top direction is a layering direction of semiconductor layers of the semiconductor laser device 1, and is a Y-axis direction in the drawing, and a width direction is a horizontal direction perpendicular to an emission direction, and is an X-axis in the drawing.

As illustrated in FIG. 1, with the semiconductor laser device 1 according to the comparative example, a current injection region $R_2$ is formed on a waveguide region $R_1$. As will be described later with reference to FIG. 2, the current injection region $R_2$ is a region where an electrode is mounted, and where current is injected into the waveguide region $R_1$. The waveguide region $R_1$ here is a region which acts to confine laser light in a waveguide layer by a structure illustrated in FIG. 2 described later, and is functionally determined. This is because it is difficult to uniformly describe the waveguide region $R_1$ due to there being various types of waveguide structure; for example, a waveguide having a ridge structure as illustrated in FIG. 2 does not include a boundary at a waveguide layer itself, but a buried waveguide includes a boundary at a waveguide layer itself.

As illustrated in FIG. 2, a semiconductor laser device having a ridge structure is illustrated as the semiconductor laser device 1 according to the comparative example. An example of a specific configuration is given as follows for the sake of explanation; the semiconductor laser device 1 according to the comparative example includes an upper electrode 5, a lower electrode 6 formed on a lower surface, a substrate 7 made of n-type GaAs, a semiconductor layer section 2 formed on the substrate 7, and a passivation film 15, for example. Moreover, the semiconductor layer section 2 includes an n-type buffer layer 8, an n-type cladding layer 9, an n-type guide layer 10, an active layer 11, a p-type guide layer 12, a p-type cladding layer 13, and a p-type contact layer 14. These layers 8, 9, 10, 11, 12, 13, and 14 are sequentially formed on the substrate 7.

The n-type buffer layer 8 is made of GaAs, and is a buffer layer for allowing a layered structure of high-quality epitaxial layers to grow on the substrate 7. The n-type cladding layer 9 and the n-type guide layer 10 are made of AlGaAs. Refractive indices and thicknesses of the layers 9 and 10 are set to realize a desired optical confinement state in a layered direction. Additionally, an Al composition of the n-type guide layer 10 is 15% or more and less than 40%, for example. Furthermore, the refractive index of the n-type cladding layer 9 is smaller than that of the n-type guide layer 10. Moreover, the thickness of the n-type guide layer 10 is preferably 50 nm or more, and is about 1000 nm, for example. The thickness of the n-type cladding layer 9 is preferably about 1 µm to 3 µm. Moreover, these n-type semiconductor layers contain silicon (Si) as an n-type dopant, for example.

The active layer 11 includes a lower barrier layer, a quantum well layer, and an upper barrier layer, and has a single quantum well (SQW) structure. The lower barrier layer and the upper barrier layer function as barriers for confining carriers in the quantum well layer, and are made of unintentionally doped high-purity AlGaAs. The quantum well layer is made of unintentionally doped high-purity InGaAs. An In composition and a film thickness of the quantum well layer, and compositions of the lower barrier layer and the upper barrier layer are set according to a desired center emission wavelength (for example, 900 nm to 1080 nm). Additionally, the structure of the active layer 11 may be a multi quantum well (MQW) structure having a layered structure including a desired number of sets of the quantum well layer and the barrier layers formed on and below the quantum well layer, or may be a single quantum well structure. Moreover, a configuration of an unintentionally doped high-purity layer is described above, but a donor or an acceptor may be intentionally doped to the quantum well layer, the lower barrier layer, and the upper barrier layer.

The p-type guide layer 12 and the p-type cladding layer 13 are paired with the n-type cladding layer 9 and the n-type guide layer 10 described above, are made of AlGaAs. Refractive indices and thicknesses of the layers 12 and 13 are set to realize a desired optical confinement state in the layered direction. An Al composition of the p-type guide layer 12 is 15% or more and less than 40%, for example. The refractive index of the p-type cladding layer 13 is smaller than that of the p-type guide layer 12. An Al composition of the p-type cladding layer 13 is set slightly greater than that of the n-type cladding layer 9 so as to shift an optical field in the layers in a direction of the n-type cladding layer 9 and reduce a waveguide loss. An Al composition of the p-type guide layer 12 is set smaller than the Al composition of the p-type cladding layer 13. Moreover, the thickness of the p-type guide layer 12 is preferably 50 nm or more, and is about 1000 nm, for example. The thickness of the p-type cladding layer 13 is preferably about 1 µm to 3 µm. Moreover, these p-type semiconductor layers contain carbon (C) as a p-type dopant. A C concentration of the p-type guide layer 12 is set to 0.1 to $1.0 \times 10^{17}$ cm$^{-3}$, for example, and is suitably about 0.5 to $1.0 \times 10^{17}$ cm$^{-3}$. A C concentration of the p-type cladding layer 13 is set to $1.0 \times 10^{17}$ cm$^{-3}$ or greater, for example. Moreover, the p-type contact layer 14 is made of GaAs doped with a high concentration of Zn or C. Light of the semiconductor laser device 1 is present mainly in regions of the n-type guide layer 10, the active layer 11, and the p-type guide layer 12 with respect to the Y-axis direction, which is the layered direction. Accordingly, these layers may be collectively referred to as a waveguide layer.

The passivation film 15 is an insulating film of SiN$_x$, for example, and includes an opening A. Moreover, with the semiconductor laser device 1 including a ridge structure, according to the comparative example, a ridge structure for confining laser light in the X-axis direction is formed at at least a part of the p-type cladding layer 13 immediately below the opening A.

A width of the waveguide region in the horizontal direction (referred to as "waveguide width" in the drawing) of a laser device having a ridge structure is a width, in the X direction, of the ridge structure provided immediately below the opening A, as illustrated in FIG. 2, and a width of the current injection region in the horizontal direction (referred to as "current injection width" in the drawing) is a width of the opening A in the X direction.

Furthermore, a coverage width takes a value obtained by dividing, by two, a result of subtracting the width of the current injection region in the horizontal direction from the width of the waveguide region in the horizontal direction, and a calculation formula is as follows:

coverage width=(waveguide width−current injection width)/2.

Additionally, the coverage widths on left and right of a waveguide do not necessarily have to take the same value, but the coverage widths are preferably the same for the left and the right when taking into account a symmetric property of the radiation angle of laser light radiated by the device, for example.

In each embodiment below, the width of the waveguide region in the horizontal direction and the width of the current injection region in the horizontal direction are defined in the same manner. Furthermore, the embodiments of the present disclosure are not limited to a laser device having a ridge structure; however, although description of a cross-sectional structure is omitted, the laser device of each embodiment described below is assumed to have the same structure as the cross-sectional structure illustrated in FIG. 2.

First Embodiment

Figure 3:
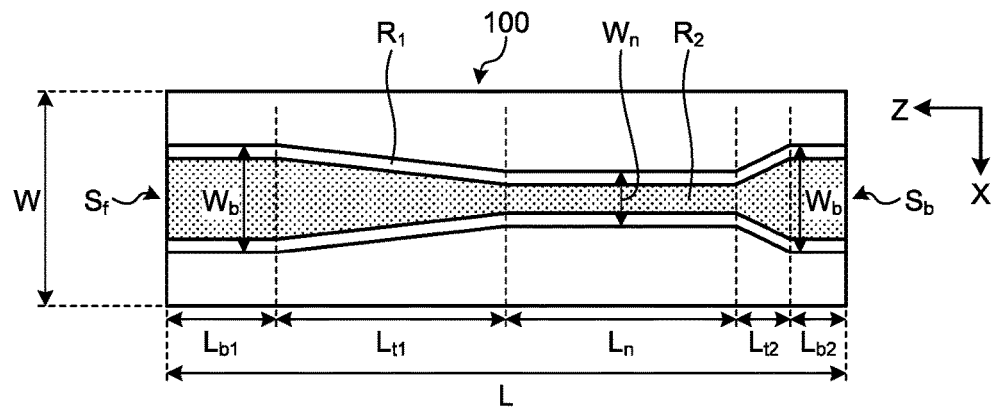
FIG. 3 is a top view schematically illustrating a configuration of a semiconductor laser device according to a first embodiment.

FIG. 3 is a top view schematically illustrating a configuration of a semiconductor laser device according to a first embodiment. As illustrated in FIG. 3, a semiconductor laser device 100 according to the first embodiment is an edge emission type semiconductor laser device, where a waveguide mode is multi-mode. Furthermore, with the semiconductor laser device 100 according to the first embodiment, a width of a waveguide region $R_1$ at an emission direction front facet $S_f$ and a width of the waveguide region $R_1$ at an emission direction rear facet $S_b$ are a substantially same width $W_b$, while width $W_n$ of the waveguide region $R_1$ is at least partially narrower than the width $W_b$ between the emission direction front facet $S_f$ and the emission direction rear facet $S_b$.

Furthermore, as illustrated in FIG. 3, with the semiconductor laser device 100 according to the first embodiment, a current injection region $R_2$ is formed on the waveguide region $R_1$ with certain margins on both ends of the current injection region $R_2$, and as a result, a width of the current injection region $R_2$ is at least partially narrower than the width of the current injection region $R_2$ at the emission direction front facet $S_f$ between the emission direction front facet $S_f$ and the emission direction rear facet $S_b$.

A shape of the semiconductor laser device 100 according to the first embodiment will now be described in greater detail. A distance (i.e., total length) L between the emission direction front facet $S_f$ and the emission direction rear facet $S_b$ is so-called resonator length, and is preferably 800 µm to 6 mm, or more preferably 3 mm to 5 mm. Additionally, width W of the semiconductor laser device 100 may take any value as long as it is sufficiently wider than the width $W_b$.

As illustrated in FIG. 3, with the semiconductor laser device 100 according to the first embodiment, the waveguide region $R_1$ includes, on the emission direction front side, a part where the width is constant at $W_b$ (i.e., parallel). Length $L_{b1}$ of the waveguide region $R_1$ where the width is constant is preferably 80% or less, or more preferably 50% or less, of the total length L. Moreover, the length $L_{b1}$ is preferably 5 µm or more, for example, and may be equal to or longer than processing accuracy at the time of cutting the emission direction front facet $S_f$. The longer the length $L_{b1}$, the smaller the part of the waveguide region $R_1$ where the width is narrow, and this is suitable because an increase in voltage at the time of current injection in the waveguide region $R_1$ can be suppressed. However, if the length of $L_{b1}$ is too long, a suppression effect on a radiation angle at the time of radiation from the emission direction front facet $S_f$ is reduced.

Furthermore, as illustrated in FIG. 3, with the semiconductor laser device 100 according to the first embodiment, the waveguide region $R_1$ includes, also on the emission direction rear side, a part where the width is constant at $W_b$ (i.e., parallel). Length $L_{b2}$ of the waveguide region $R_1$ where the width is constant is preferably 10% or less, or more preferably 1% or less, of the total length L. Moreover, the length $L_{b2}$ is preferably 5 μm or more, for example, and may be longer than processing accuracy at the time of cleaving the emission direction rear facet $S_b$. Additionally, the length $L_{b2}$ is preferably shorter than the length $L_{b1}$.

The width $W_b$ is preferably 20 μm to 400 μm, for example, and is more preferably 30 μm to 200 μm. Specifically, the width $W_b$ is preferably 100 μm. This is because, when taking into account that radiated light of the semiconductor laser device 100 is to be coupled into an optical fiber at a later stage, the value of the width $W_b$ is suitably in a range of ±50 μm of a core diameter of the optical fiber at a later stage from the standpoint of optical coupling. Generally, when the width $W_b$ is increased, optical density at the emission direction front facet $S_f$ is reduced, and this is preferable from the standpoint of increased reliability against facet damage. However, if the width $W_b$ is wide, optical coupling efficiency is reduced. Generally, to achieve constant optical coupling efficiency, a product of the width $W_b$ and the radiation angle has to be constant. According to the present disclosure, the radiation angle may be reduced, and thus, the same optical coupling efficiency can be realized for a more reliable semiconductor laser device with a wider $W_b$.

As described above, with the semiconductor laser device 100 according to the first embodiment, the width $W_n$ of the waveguide region $R_1$ is narrower than the width $W_b$ between the emission direction front facet $S_f$ and the emission direction rear facet $S_b$. In the example of the shape illustrated in FIG. 3, the width of such a part is constant at $W_n$ (i.e., parallel). Length $L_n$ of the waveguide region $R_1$ where the width is $W_n$ is zero or more, and is preferably 40% or less of the total length L. This is because, if the length $L_n$ is too long, an increase in voltage becomes great, but for reasons described later, if the width $W_n$ of the waveguide region $R_1$ is at least partially narrower than the width $W_b$ between the emission direction front facet $S_f$ and the emission direction rear facet $S_b$, a suppression effect on the radiation angle of radiation from the emission direction front facet $S_f$ is achieved.

For example, the width $W_n$ is preferably 5% to 95% of the width $W_b$. This is because, if the width $W_n$ is too narrow, the voltage is increased, but if the width $W_n$ is too wide, the suppression effect on the radiation angle at the time of radiation from the emission direction front facet $S_f$ is reduced. Additionally, the width $W_n$ does not have to be so narrowed that the waveguide mode for laser light that is guided in the waveguide region $R_1$ becomes the single mode.

With the waveguide region $R_1$ connecting the waveguide region $R_1$ where the width is $W_n$ and the waveguide region $R_1$ where the width is $W_b$, the width may be changed linearly, in a curved manner, or stepwise. Moreover, the width does not have to be monotonically increased or monotonically decreased, but in the case of a continuous change, such as monotonic increase or monotonic decrease, the shape is simplified and manufacture is facilitated. To put it differently, the width $W_b$ is not necessarily a maximum width of the waveguide region $R_1$, and a shape where the part with the maximum width is another part is also allowed.

On the other hand, the width $W_n$ is a minimum width of the waveguide region $R_1$, and it is sufficient if the minimum width is narrower than the width of the waveguide region $R_1$ at the emission direction front facet $S_f$ and the emission direction rear facet $S_b$.

Length $L_{t2}$ of the waveguide region $R_1$ connecting the waveguide region $R_1$ where the width is $W_n$ and the waveguide region $R_1$ where the width is $W_b$, on a side closer to the emission direction rear facet $S_b$, is greater than zero, and is preferably 10% or less of the total length L, or more preferably 3% or less of the total length L, for example. This is because, if the length $L_{t2}$ is too long, current-optical output characteristics are degraded, in addition to an increased voltage.

Length $L_{t1}$ of the waveguide region $R_1$ connecting the waveguide region $R_1$ where the width is $W_n$ and the waveguide region $R_1$ where the width is $W_b$, on a side closer to the emission direction front facet $S_f$, is preferably greater than zero and longer than the length $L_{t2}$, for example. This is because, if the length $L_{t1}$ is too long, the voltage is greatly increased, and if the length $L_{t1}$ is too short, a waveguide loss is increased. The length $L_{t1}$ may be set to length obtained by subtracting a sum of other lengths $L_{b1}$, $L_n$, $L_{t2}$, and $L_{b2}$ from the total length L.

Now, manufacturing steps of the semiconductor laser device 100 configured in the above manner will be described.

Figure 4:
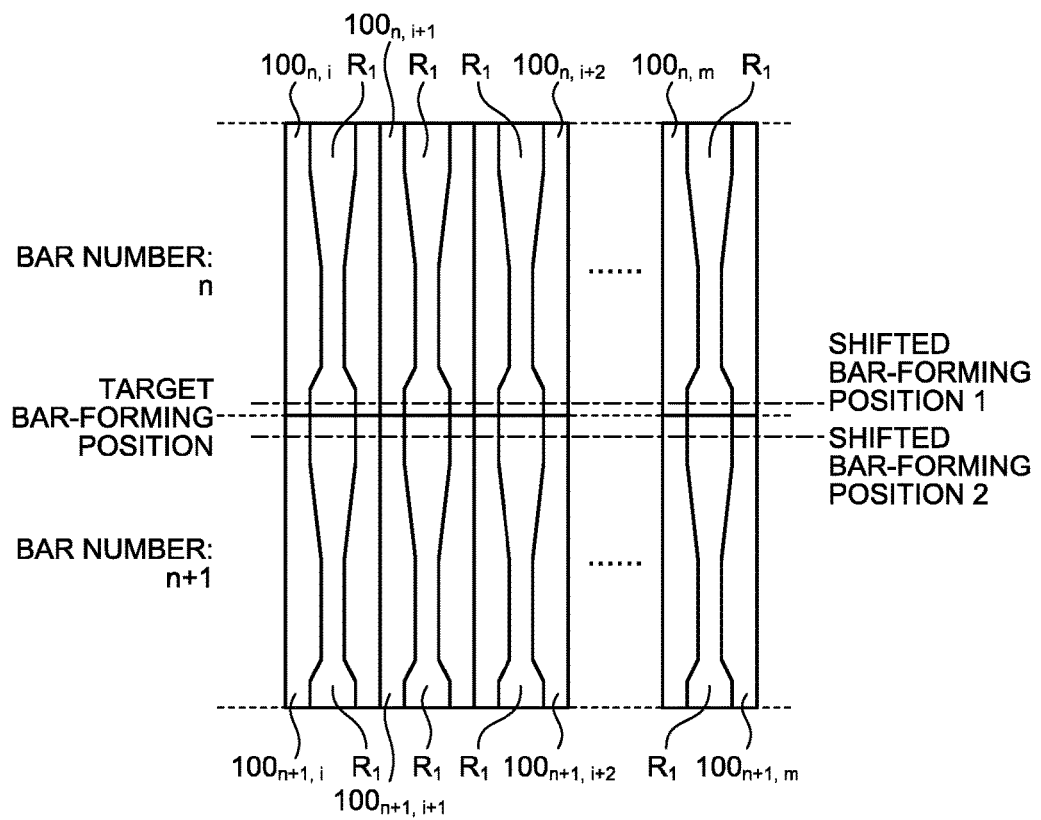
FIG. 4 is a diagram schematically illustrating a part of a step of cutting out each semiconductor laser device from a semiconductor wafer.

FIG. 4 is a diagram schematically illustrating a part of a step of cutting out each semiconductor laser device from a semiconductor wafer. As illustrated in FIG. 4, a step called bar-formation is performed during cutting out of each semiconductor laser device from a semiconductor wafer. Bar-formation refers to cleaving of a semiconductor wafer into a bar shape where a plurality of semiconductor laser devices are arranged next to one another. The example in FIG. 4 illustrates bar-formation where bar No. n where semiconductor laser devices $100_{n,i}, \ldots, 100_{n,m}$ are arranged next to one another, and bar No. n+1 where semiconductor laser devices $100_{n+1,i}, \ldots, 100_{n+1,m}$ are arranged next to one another are cleaved. Here, each of the semiconductor laser devices $100_{n,i}, \ldots, 100_{n,m}, 100_{n+1,i}, \ldots, 100_{n+1,m}$ is assumed to have the same configuration as the semiconductor laser device 100 according to the first embodiment, and only the shape of the waveguide region $R_1$ is illustrated for the sake of simplicity.

As illustrated in FIG. 4, at the time of forming bar No. n and bar No. n+1, cleavage is possibly performed not at a target bar-forming position, but at a shifted bar-forming position 1 or a shifted bar-forming position 2. With the semiconductor laser device 100, even in such a case, because the width of the waveguide region $R_1$ at the emission direction front facet $S_f$ and the width of the waveguide region $R_1$ at the emission direction rear facet $S_b$ are substantially the same width $W_b$, the shape of the waveguide region $R_1$ of the semiconductor laser device 100 is not affected by an error in the cleavage position. A lower limit of the length $L_{b2}$ described above is made longer than the processing accuracy for cleavage of the emission direction rear facet $S_b$ to achieve such an effect.

Figure 5:
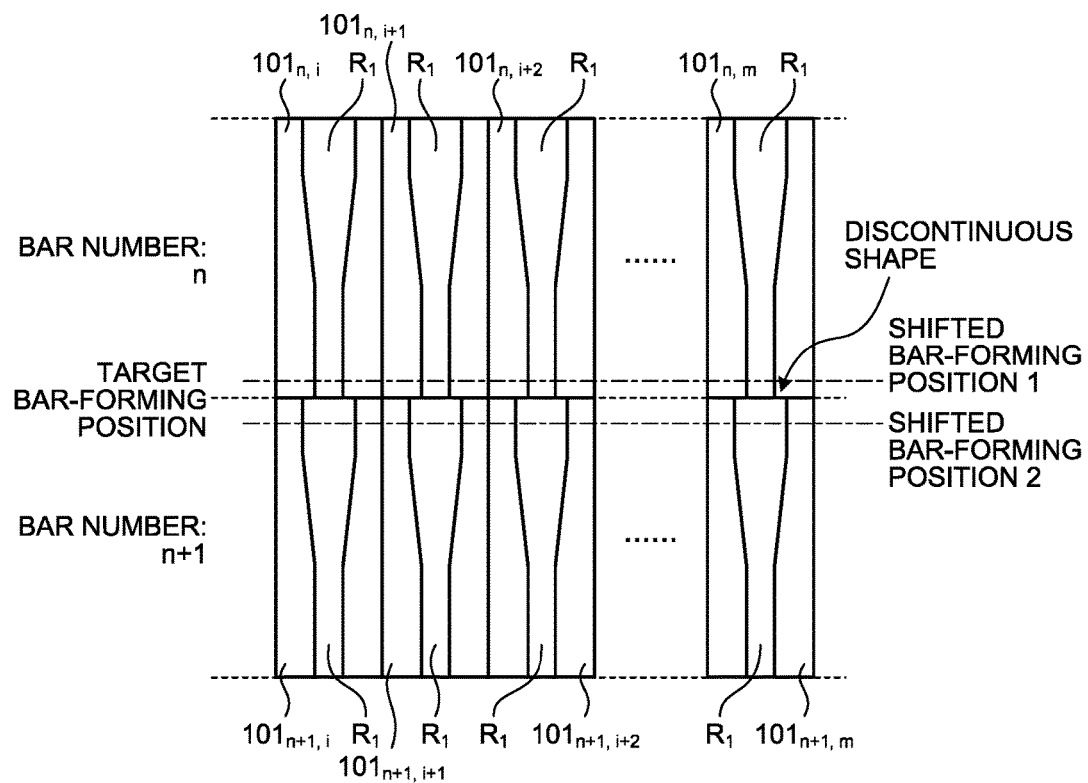
FIG. 5 is a diagram schematically illustrating a comparative example of a part of the step of cutting out each semiconductor laser device from a semiconductor wafer.

FIG. 5 is a diagram schematically illustrating a comparative example of the part of the step of cutting out each semiconductor laser device from a semiconductor wafer. The example in FIG. 5 illustrates bar-formation where bar No. n where semiconductor laser devices $101_{n,i}, \ldots, 101_{n,m}$ are arranged next to one another, and bar No. n+1 where semiconductor laser devices $101_{n+1,i}, \ldots, 101_{n+1,m}$ are arranged next to one another are cleaved. Here, each of the semiconductor laser devices $101_{n,i}$, ..., $101_{n,m}$, $101_{n+1,i}$, ..., $101_{n+1,m}$ is assumed to be an example modification where the lengths $L_{b2}$ and $L_{r2}$ of the configuration of the semiconductor laser device 100 according to the first embodiment are made zero, and only the shape of the waveguide region $R_1$ is illustrated.

Also in this case, a situation is considered where, at the time of forming bar No. n and bar No. n+1, cleavage is performed not at a target bar-forming position, but at a shifted bar-forming position 1 or a shifted bar-forming position 2. In such a case, with the semiconductor laser device according to the comparative example, because the width of the waveguide region $R_1$ at the emission direction front facet $S_f$ and the width of the waveguide region $R_1$ at the emission direction rear facet $S_b$ are different, an unintended discontinuous shape is possibly formed due to the error in the bar-forming position. With respect to this point, compared with the comparative example illustrated in FIG. 5, the semiconductor laser device 100 according to the first embodiment is desirable because manufacture thereof is easy even when taking manufacturing variations into account.

Figure 6:
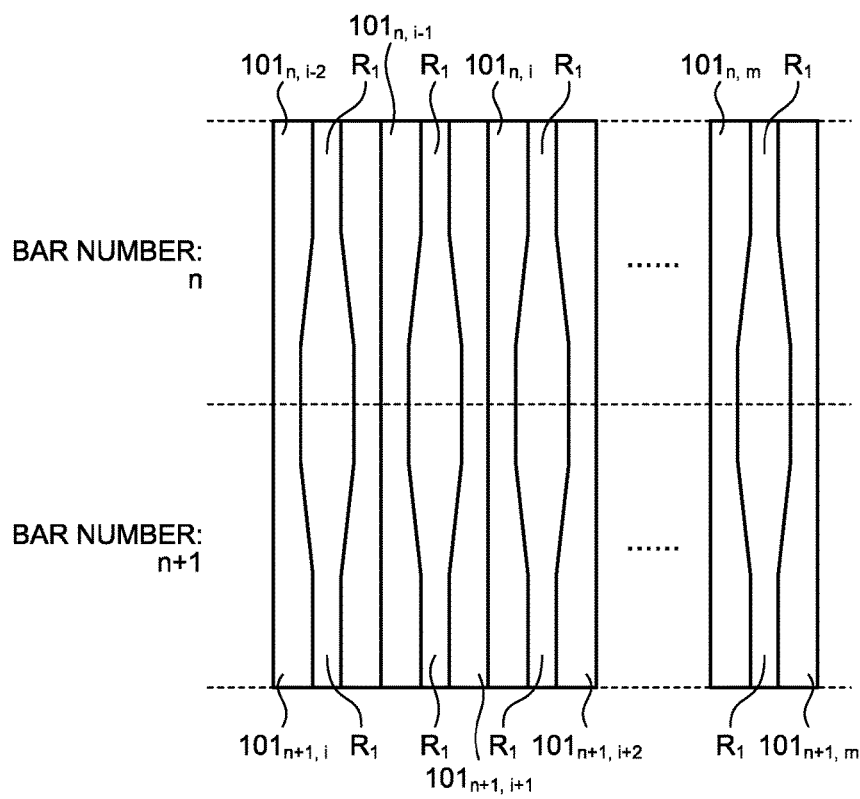
FIG. 6 is a diagram schematically illustrating another comparative example of the part of the step of cutting out each semiconductor laser device from a semiconductor wafer.

FIG. 6 is a diagram schematically illustrating another comparative example of the part of the step of cutting out each semiconductor laser device from a semiconductor wafer. The example in FIG. 6 illustrates bar-formation where bar No. n where semiconductor laser devices $101_{n,i-2}$, ..., $101_{n,m}$ are arranged next to one another, and bar No. n+1 where semiconductor laser devices $101_{n+1,i}$, ..., $101_{n+1,m}$ are arranged next to one another are cleaved. Here, each of the semiconductor laser devices $101_{n,i-2}$, ..., $101_{n,m}$, $101_{n+1,i}$, ..., $101_{n+1,m}$ is assumed to be an example modification where the lengths $L_{b2}$ and $L_{r2}$ of the configuration of the semiconductor laser device 100 according to the first embodiment are made zero, and only the shape of the waveguide region $R_1$ is illustrated.

As illustrated in FIG. 6, when bar No. n and bar No. n+1 are arranged with the emission direction front facets $S_f$ facing each other, an unintended discontinuous shape formed due to an error in the bar-forming position may be avoided. Additionally, although not illustrated in FIG. 6, bar No. n−1 and bar No. n are also arranged with the emission direction rear facets $S_b$ facing each other, and arrangement is performed in an alternate manner. However, as illustrated in FIG. 6, in the case of alternate arrangement, an arranged order of numbers of the semiconductor laser devices are reversed between bar No. n and bar No. n+1, and this is not desirable from the standpoint of traceability or management of the semiconductor laser devices. With respect to this point, compared with the comparative example illustrated in FIG. 5, the semiconductor laser device 100 according to the first embodiment is desirable also from the standpoint of traceability and management.

The semiconductor laser device 100 configured in the above manner is an edge emission type semiconductor laser device, where a waveguide mode of the waveguide region $R_1$ is multi-mode, and thus, laser light is emitted in a plurality of waveguide modes. However, because the width of the waveguide region $R_1$ is at least partially narrowed to $W_n$ between the emission direction front facet $S_f$ and the emission direction rear facet $S_b$, the number of higher order modes is appropriately suppressed. As a result, because the radiation angle tends to be greater for laser light in higher order modes, the semiconductor laser device 100 having the present configuration achieves the suppression effect on the radiation angle of the laser light radiated from the emission direction front facet $S_f$.

Furthermore, with the semiconductor laser device 100 having the present configuration, the width of the waveguide region $R_1$ is at least partially narrowed between the emission direction front facet $S_f$ and the emission direction rear facet $S_b$, but the part where the width is narrowed is only a part of the waveguide region $R_1$, and thus, an increase in the voltage at the time of injection of current in the waveguide region $R_1$ can be suppressed.

Furthermore, with the semiconductor laser device 100 having the present configuration, the width of the waveguide region $R_1$ at the emission direction front facet $S_f$ and the width of the waveguide region $R_1$ at the emission direction rear facet $S_b$ are substantially the same width $W_b$, and thus, tolerance to manufacturing error, traceability, and manageability at the time of cutting out each semiconductor laser device from the semiconductor wafer are improved.

Second Embodiment

Figure 7:
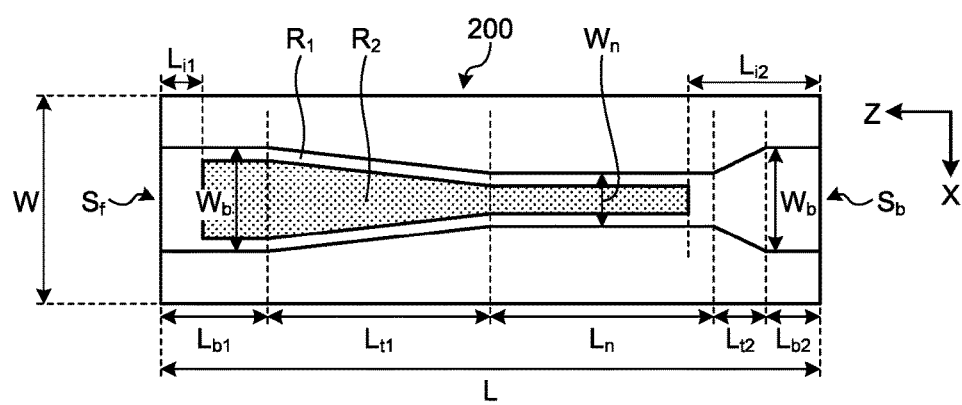
FIG. 7 is a top view schematically illustrating a configuration of a semiconductor laser device according to a second embodiment.

FIG. 7 is a top view schematically illustrating a configuration of a semiconductor laser device according to a second embodiment. As illustrated in FIG. 7, a semiconductor laser device 200 according to the second embodiment is an edge emission type semiconductor laser device, where a waveguide mode is multi-mode. Furthermore, with the semiconductor laser device 200 according to the second embodiment, the width of the waveguide region $R_1$ at the emission direction front facet $S_f$ and the width of the waveguide region $R_1$ at the emission direction rear facet $S_b$ are substantially the same width $W_b$, while the width $W_n$ of the waveguide region $R_1$ is at least partially narrower than the width $W_b$ between the emission direction front facet $S_f$ and the emission direction rear facet $S_b$.

Furthermore, as illustrated in FIG. 7, with the semiconductor laser device 200 according to the second embodiment, the current injection region $R_2$ is not provided in a range of length $L_{i1}$ from the emission direction front facet $S_f$, and in a range of length $L_{i2}$ from the emission direction rear facet $S_b$. The range of the length $L_{i1}$ or the length $L_{i2}$ where the current injection region $R_2$ is not provided is referred to also as a current non-injection region. Additionally, with the semiconductor laser device 200 according to the second embodiment illustrated in FIG. 7, the current non-injection region is provided in both the range of the length $L_{i1}$ from the emission direction front facet $S_f$ and the range of the length $L_{i2}$ from the emission direction rear facet $S_b$, but a configuration where the current non-injection region is provided in either one of the ranges is also possible. When the current non-injection region is provided near the emission direction front facet $S_f$ or the emission direction rear facet $S_b$, current injection for laser light at the emission direction front facet $S_f$ or emission direction rear facet $S_b$ can be suppressed, and possibility of the emission direction front facet $S_f$ or the emission direction rear facet $S_b$ being damaged by energy from the laser light is reduced. As a result, an increasing effect on the reliability of the semiconductor laser device 200 is achieved. Additionally, with the semiconductor laser device 200 according to the second embodiment illustrated in FIG. 7, current is not injected from the current non-injection region, but the waveguide region $R_1$ is formed.

As described above with reference to FIG. 2, the current injection region $R_2$ is actually an opening formed to the passivation film 15 made of $SiN_x$, for example. Accordingly, a method for providing the current non-injection region in the range of the length $L_{i1}$ from the emission direction front facet $S_f$ and the range of the length $L_{i2}$ from the emission direction rear facet $S_b$ may be achieved by not performing removal of the passivation film 15 at the current non-injection region.

The length $L_{t1}$ from the emission direction front facet $S_f$, which is the region where the current non-injection region is provided, is preferably 5 μm or more and 300 μm or less, for example, and is more preferably 5 μm or more and 150 μm or less. The length $L_{t2}$ from the emission direction rear facet $S_b$, which is the region where the current non-injection region is provided, is preferably 5 μm or more and 300 μm or less, for example, and is more preferably 5 μm or more and 100 μm or less. With respect to a relationship between the length $L_{t1}$ and the length $L_{t2}$, the length $L_{t1}$ is preferably equal to or longer than the length $L_{t2}$.

If the length $L_{t2}$ and the length $L_{b2}$ are too long, the current-optical output characteristics of the semiconductor laser device 200 may become degraded. If the length $L_{t2}$ is made longer than the sum of the length $L_{t2}$ and the length $L_{b2}$, current is not injected in a region of length $L_{t2}+L_{b2}$ from the emission direction rear facet $S_b$, and this is more desirable because degradation of the current-optical output characteristics of the semiconductor laser device 200 is suppressed.

Desirable ranges of the total length L, the width W, and the lengths $L_{b1}$, $L_n$, $L_{t1}$, $L_{t2}$, and $L_{b2}$ of the semiconductor laser device 200 may be set in the same manner as for the semiconductor laser device 100 according to the first embodiment.

The semiconductor laser device 200 configured in the above manner is an edge emission type semiconductor laser device, where a waveguide mode of the waveguide region $R_1$ is multi-mode, and thus, laser light is emitted in a plurality of waveguide modes. However, because the width of the waveguide region $R_1$ is at least partially narrowed to $W_n$ between the emission direction front facet $S_f$ and the emission direction rear facet $S_b$, the number of higher order modes is appropriately suppressed. As a result, because the radiation angle tends to be greater for laser light in higher order modes, the semiconductor laser device 200 having the present configuration achieves the suppression effect on the radiation angle of the laser light radiated from the emission direction front facet $S_f$.

Furthermore, with the semiconductor laser device 200 having the present configuration, the width of the waveguide region $R_1$ is at least partially narrowed between the emission direction front facet $S_f$ and the emission direction rear facet $S_b$, but the part where the width is narrowed is only a part of the waveguide region $R_1$, and thus, an increase in the voltage at the time of injection of current in the waveguide region $R_1$ can be suppressed.

Furthermore, with the semiconductor laser device 200 having the present configuration, the width of the waveguide region $R_1$ at the emission direction front facet $S_f$ and the width of the waveguide region $R_1$ at the emission direction rear facet $S_b$ are substantially the same width $W_b$, and thus, tolerance to manufacturing error, traceability, and manageability at the time of cutting out each semiconductor laser device from the semiconductor wafer are improved.

Moreover, with the semiconductor laser device 200 having the present configuration, the current non-injection region is provided near the emission direction front facet $S_f$ or the emission direction rear facet $S_b$, and thus, an increasing effect on the reliability of the semiconductor laser device 200 is achieved.

Third Embodiment

Figure 8:
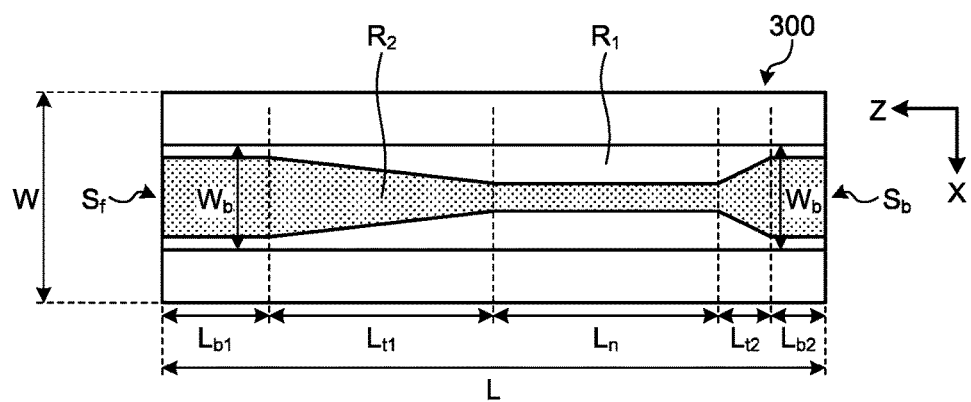
FIG. 8 is a top view schematically illustrating a configuration of a semiconductor laser device according to a third embodiment.

FIG. 8 is a top view schematically illustrating a configuration of a semiconductor laser device according to a third embodiment. As illustrated in FIG. 8, a semiconductor laser device 300 according to the third embodiment is an edge emission type semiconductor laser device, where a waveguide mode is multi-mode. With the semiconductor laser device 300 according to the third embodiment, the width of the waveguide region $R_1$ is substantially the same width $W_b$ between the emission direction front facet $S_f$ and the emission direction rear facet $S_b$, but the width of the current injection region $R_2$ is at least partially narrower, between the emission direction front facet $S_f$ and the emission direction rear facet $S_b$, than the width of the current injection region $R_2$ at the emission direction front facet $S_f$.

Also with the semiconductor laser device 300 configured in the above manner, because guiding of laser light in a higher order waveguide mode is suppressed by a part where the width of the current injection region $R_2$ is narrowed, the number of higher order modes may be appropriately suppressed.

In the example of the semiconductor laser device 300 illustrated in FIG. 8, $W_b$ is the width of the waveguide region $R_1$ between the emission direction front facet $S_f$ and the emission direction rear facet $S_b$. $W_b$ is 100 μm, for example. The width of the current injection region $R_2$ in a range of the length $L_{b1}$ from the emission direction front facet $S_f$, where the width of the current injection region $R_2$ is wide, is preferably designed to be narrower than the width of the waveguide region $R_1$ by 10 μm, for example. That is, for example, if the width $W_b$ of the waveguide region $R_1$ is 100 μm, the width of the current injection region $R_2$ is 90 μm. The width of the current injection region $R_2$ in a range of the length $L_n$ at a center, where the width of the current injection region $R_2$ is narrow, is preferably designed to be narrower than the width of the waveguide region $R_1$ by 70 μm, for example. That is, for example, if the width $W_b$ of the waveguide region $R_1$ is 100 μm, the width of the current injection region $R_2$ is 30 μm.

Moreover, the length $L_{b2}$ of the range from the emission direction rear facet $S_b$, where the width of the current injection region $R_2$ is wide, is zero or more, and is preferably 10% or less of the total length L, for example. Additionally, even if the length $L_{b2}$ is zero, the width of the waveguide region $R_1$ is $W_b$, and thus, also in the case of the semiconductor laser device 300 according to the present embodiment, a problem caused by an error in the bar-forming position described with reference to FIGS. 4 to 6 is not caused.

Desirable ranges of the total length L, the width W, and the lengths $L_{b1}$, $L_n$, $L_{t1}$, $L_{t2}$, and $L_{b2}$ of the semiconductor laser device 300 may be set in the same manner as for the semiconductor laser device 100 according to the first embodiment.

Moreover, also with the semiconductor laser device 300 according to the present embodiment, the current non-injection region may be provided near the emission direction front facet $S_f$ or the emission direction rear facet $S_b$, as in the case of the semiconductor laser device 200 according to the second embodiment.

The semiconductor laser device 300 configured in the above manner is an edge emission type semiconductor laser device, where a waveguide mode of the waveguide region $R_1$ is multi-mode, and thus, laser light is emitted in a plurality of waveguide modes. However, because the width of the current injection region $R_2$ is at least partially narrowed between the emission direction front facet $S_f$ and the emission direction rear facet $S_b$, the number of higher order modes is appropriately suppressed. As a result, because the radiation angle tends to be greater for laser light in higher order modes, the semiconductor laser device 300 having the present configuration achieves the suppression effect on the radiation angle of the laser light radiated from the emission direction front facet $S_f$.

Furthermore, with the semiconductor laser device 300 having the present configuration, the width of the current injection region $R_2$ is at least partially narrowed between the emission direction front facet $S_f$ and the emission direction rear facet $S_b$, but the part where the width is narrowed is only a part of the current injection region $R_2$, and thus, an increase in the voltage at the time of injection of current in the current injection region $R_2$ can be suppressed.

Furthermore, with the semiconductor laser device 300 having the present configuration, the width of the waveguide region $R_1$ at the emission direction front facet $S_f$ and the width of the waveguide region $R_1$ at the emission direction rear facet $S_b$ are substantially the same width $W_b$, and thus, tolerance to manufacturing error, traceability, and manageability at the time of cutting out each semiconductor laser device from the semiconductor wafer are improved.

Fourth Embodiment

Figure 9:
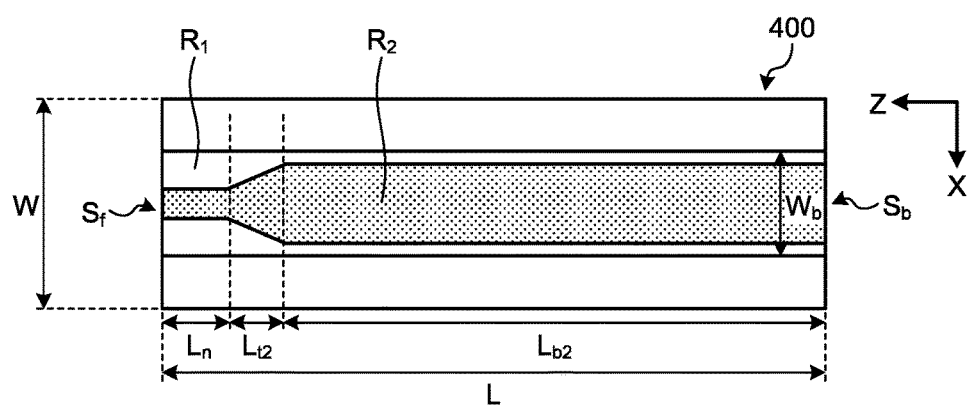
FIG. 9 is a top view schematically illustrating a configuration of a semiconductor laser device according to a fourth embodiment.

FIG. 9 is a top view schematically illustrating a configuration of a semiconductor laser device according to a fourth embodiment. As illustrated in FIG. 9, a semiconductor laser device 400 according to the fourth embodiment is an edge emission type semiconductor laser device, where a waveguide mode is multi-mode, and the width of the current injection region $R_2$ is at least partially narrower, between the emission direction front facet $S_f$ and the emission direction rear facet $S_b$, than the width of the current injection region $R_2$ at the emission direction rear facet $S_b$. That is, with the semiconductor laser device 300 according to the third embodiment, the width of the current injection region $R_2$ is the maximum at the emission direction front facet $S_f$, but with the semiconductor laser device 400 according to the fourth embodiment, the width of the current injection region $R_2$ at the emission direction front facet $S_f$ is narrower than the width of the current injection region $R_2$ at other regions.

Also with the semiconductor laser device 400 configured in the above manner, because guiding of laser light in a higher order waveguide mode is suppressed by a part where the width of the current injection region $R_2$ is narrowed, the number of higher order modes may be appropriately suppressed. Moreover, if the width of the current injection region $R_2$ is narrow near the emission direction front facet $S_f$, a suppression effect on hole burning caused by a high intensity of optical energy near the emission direction front facet $S_f$ is achieved.

In the example of the semiconductor laser device 400 illustrated in FIG. 9, $W_b$ is the width of the waveguide region $R_1$ between the emission direction front facet $S_f$ and the emission direction rear facet $S_b$. $W_b$ is 100 µm, for example. The width of the current injection region $R_2$ in a range of the length $L_{b2}$ from the emission direction rear facet $S_b$, where the width of the current injection region $R_2$ is wide, is preferably designed to be narrower than the width of the waveguide region $R_1$ by 10 µm, for example. That is, for example, if the width $W_b$ of the waveguide region $R_1$ is 100 µm, the width of the current injection region $R_2$ is 90 µm. The width of the current injection region $R_2$ in a range of the length $L_n$ from the emission direction front facet $S_f$, where the width of the current injection region $R_2$ narrow, is preferably designed to be narrower than the width of the waveguide region $R_1$ by 70 µm, for example. That is, for example, if the width $W_b$ of the waveguide region $R_1$ is 100 µm, the width of the current injection region $R_2$ is 30 µm.

Additionally, even if the length $L_{b2}$ is zero, the width of the waveguide region $R_1$ is $W_b$, and thus, also in the case of the semiconductor laser device 400 according to the present embodiment, a problem caused by an error in the bar-forming position described with reference to FIGS. 4 to 6 is not caused.

Desirable ranges of the total length L, the width W, and the lengths $L_n$, $L_{t2}$, $L_{b2}$ of the semiconductor laser device 400 may be set in the same manner as for the semiconductor laser device 100 according to the first embodiment.

Moreover, also with the semiconductor laser device 400 according to the present embodiment, the current non-injection region may be provided near the emission direction front facet $S_f$ or the emission direction rear facet $S_b$, as in the case of the semiconductor laser device 200 according to the second embodiment.

The semiconductor laser device 400 configured in the above manner is an edge emission type semiconductor laser device, where a waveguide mode of the waveguide region $R_1$ is multi-mode, and thus, laser light is emitted in a plurality of waveguide modes. However, because the width of the current injection region $R_2$ is at least partially narrowed between the emission direction front facet $S_f$ and the emission direction rear facet $S_b$, the number of higher order modes is appropriately suppressed. As a result, because the radiation angle tends to be greater for laser light in higher order modes, the semiconductor laser device 400 having the present configuration achieves the suppression effect on the radiation angle of the laser light radiated from the emission direction front facet $S_f$.

Furthermore, with the semiconductor laser device 400 having the present configuration, the width of the current injection region $R_2$ is at least partially narrowed between the emission direction front facet $S_f$ and the emission direction rear facet $S_b$, but the part where the width is narrowed is only a part of the current injection region $R_2$, and thus, an increase in the voltage at the time of injection of current in the current injection region $R_2$ can be suppressed.

Furthermore, with the semiconductor laser device 400 having the present configuration, the width of the waveguide region $R_1$ at the emission direction front facet $S_f$ and the width of the waveguide region $R_1$ at the emission direction rear facet $S_b$ are substantially the same width $W_b$, and thus, tolerance to manufacturing error, traceability, and manageability at the time of cutting out each semiconductor laser device from the semiconductor wafer are improved.

Fifth Embodiment

Figure 10:
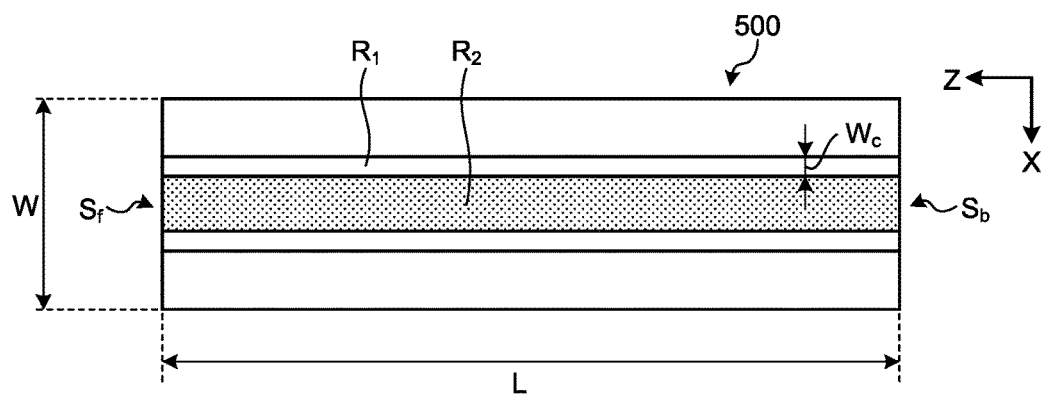
FIG. 10 is a top view schematically illustrating a configuration of a semiconductor laser device according to a fifth embodiment.

FIG. 10 is a top view schematically illustrating a configuration of a semiconductor laser device according to a fifth embodiment. As illustrated in FIG. 10, a semiconductor laser device 500 according to the fifth embodiment is an edge emission type semiconductor laser device, where a waveguide mode is multi-mode, and coverage width $W_c$ defined above is wider than that of a conventional semiconductor laser device.

Conventionally, the widths of the waveguide region $R_1$ and the current injection region $R_2$ in the horizontal direction are designed to be as close as possible to each other from the standpoint of reducing a mismatch between the waveguide region $R_1$ and the current injection region $R_2$ as much as possible. If the width of the waveguide region $R_1$ is the same, narrowing the width of the current injection region $R_2$ results in a reduced area of the current injection region $R_2$, and an increase in applied voltage. Therefore, a conventional semiconductor laser device is directed at reducing the coverage width, and the coverage width is greater than 0 µm and 5 µm or less from the standpoint of alignment accuracy in a manufacturing process.

On the other hand, the coverage width $W_c$ of the semiconductor laser device 500 according to the fifth embodiment is wider than that of a conventional semiconductor laser device, and is greater than 5 µm, for example. The reason the coverage width $W_c$ is greater for the semiconductor laser device 500 according to the fifth embodiment than for a conventional semiconductor laser device is as follows.

Because a coverage region is positioned on an outer side of the waveguide region $R_1$, if the coverage width is increased, emission in the higher order waveguide modes is more suppressed. The radiation angle tends to be greater for laser light in higher order modes, and thus, the semiconductor laser device 500 having the present configuration also achieves the suppression effect on the radiation angle of the laser light radiated from the emission direction front facet $S_f$.

Additionally, with the semiconductor laser device 500 illustrated in FIG. 10, the width of the waveguide region $R_1$ is constant from the emission direction front facet $S_f$ to the emission direction rear facet $S_b$ (i.e., a so-called straight waveguide), and also, the coverage width is constant, but if the coverage width is at least partially increased between the emission direction front facet $S_f$ and the emission direction rear facet $S_b$, emission in higher order waveguide modes is suppressed, and the suppression effect on the radiation angle of the laser light radiated from the emission direction front facet $S_f$ is achieved.

When the coverage width is increased, the suppression effect on the radiation angle of the laser light radiated from the emission direction front facet $S_f$ is achieved, but applied voltage is increased. Accordingly, the coverage width $W_c$ is preferably 23 µm or less, and is more preferably 15 µm or less. When considered relative to the width of the waveguide region $R_1$, the coverage width $W_c$ is preferably 15.3% or less, or more preferably 10% or less, of the width of the waveguide region $R_1$.

Sixth Embodiment

Figure 11:
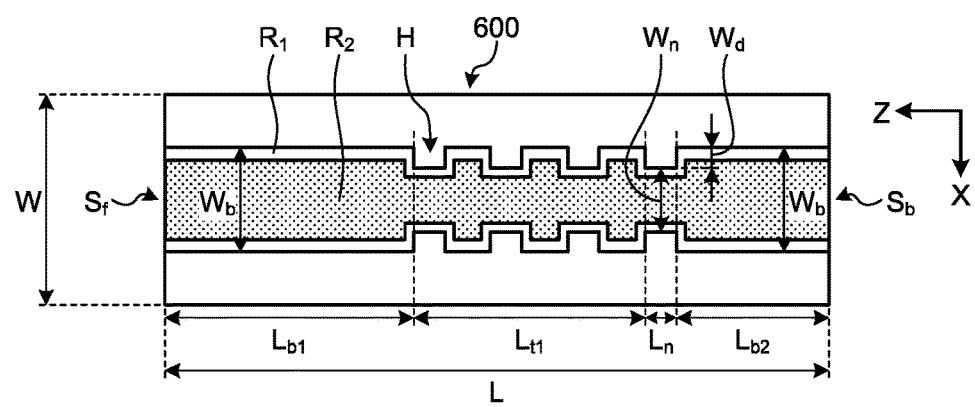
FIG. 11 is a top view schematically illustrating a configuration of a semiconductor laser device according to a sixth embodiment.

FIG. 11 is a top view schematically illustrating a configuration of a semiconductor laser device according to a sixth embodiment. As illustrated in FIG. 11, a semiconductor laser device 600 according to the sixth embodiment is an edge emission type semiconductor laser device, where a waveguide mode is multi-mode. Furthermore, with the semiconductor laser device 600 according to the sixth embodiment, the width of the waveguide region $R_1$ at the emission direction front facet $S_f$ and the width of the waveguide region $R_1$ at the emission direction rear facet $S_b$ are substantially the same width $W_b$, while the width $W_n$ of the waveguide region $R_1$ is at least partially narrower than the width $W_b$ between the emission direction front facet $S_f$ and the emission direction rear facet $S_b$.

With the semiconductor laser device 600 according to the sixth embodiment, regions of the waveguide region $R_1$ where the widths are $W_b$ and $W_n$ are connected non-monotonically. In the example of the semiconductor laser device 600 illustrated in FIG. 11, recessed shapes H where the waveguide region $R_1$ is partially narrowed are arranged between the region, near the emission direction front facet $S_f$, where the waveguide region $R_1$ has the width $W_b$ and the region, near the center, where the waveguide region $R_1$ has the width $W_n$. By at least partially narrowing the width of the waveguide region $R_1$ between the emission direction front facet $S_f$ and the emission direction rear facet $S_b$ by arranging the recessed shapes H where the waveguide region $R_1$ is partially narrowed, the number of higher order modes is appropriately suppressed. Moreover, because the semiconductor laser device 600 is a multi-mode semiconductor laser device, the current-optical output characteristics are not greatly degraded even when the recessed shapes H are arranged at parts of the waveguide region $R_1$.

In the example of the semiconductor laser device 600 illustrated in FIG. 11, when a width of the recessed shape H closest to the emission direction rear facet $S_b$ is given as $L_n$, length, from the abovementioned recessed shape H, of the waveguide region $R_1$ where the recessed shapes H are arranged in the direction of the emission direction front facet $S_f$ is given $L_n$, length of a range, near the emission direction front facet $S_f$, where the waveguide region $R_1$ has the width $W_b$ is given as $L_{b1}$, and length of a range, near the emission direction rear facet $S_b$, where the waveguide region $R_1$ has the width $W_b$ is given as $L_{b2}$, desirable ranges of the total length L, the width W, and the lengths $L_{b1}$, $L_n$, $L_{t1}$, $L_{b2}$, in addition to other parameters illustrated in FIG. 11, of the semiconductor laser device 600 may be set in the same manner as for the semiconductor laser device 100 according to the first embodiment. Additionally, with respect to a relationship between the length $L_{b1}$ and the length $L_{b2}$, the length $L_{b1}$ is preferably longer than the length $L_{b2}$.

When depths of the recessed shapes H illustrated in FIG. 11 are given as $W_d$, the depths $W_d$ may take the same value for all the recessed shapes H, or the depths $W_d$ may be gradually reduced toward the emission direction front facet $S_f$. Also with respect to widths of the recessed shapes H, the widths may take the same value for all the recessed shapes H, or the widths may be gradually reduced toward the emission direction front facet $S_f$. Arrangement intervals between the recessed shapes H may be equal intervals, or the arrangement intervals may be gradually reduced toward the emission direction rear facet $S_b$. Moreover, the arrangement of the recessed shapes H may be symmetric around a center axis of the emission direction of the semiconductor laser device 600, or the arrangement may be staggered between left and right.

Moreover, also with the semiconductor laser device 600 according to the present embodiment, the current non-injection region may be provided near the emission direction front facet $S_f$ or the emission direction rear facet $S_b$, as in the case of the semiconductor laser device 200 according to the second embodiment.

The semiconductor laser device 600 configured in the above manner is an edge emission type semiconductor laser device, where a waveguide mode of the waveguide region $R_1$ is multi-mode, and thus, laser light is emitted in a plurality of waveguide modes. However, because the width of the waveguide region $R_1$ is at least partially narrowed to $W_n$ between the emission direction front facet $S_f$ and the emission direction rear facet $S_b$, the number of higher order modes is appropriately suppressed. As a result, because the radiation angle tends to be greater for laser light in higher order modes, the semiconductor laser device 600 having the present configuration achieves the suppression effect on the radiation angle of the laser light radiated from the emission direction front facet $S_f$.

Furthermore, with the semiconductor laser device 600 having the present configuration, the width of the waveguide region $R_1$ is at least partially narrowed between the emission direction front facet $S_f$ and the emission direction rear facet $S_b$, but the part where the width is narrowed is only a part of the waveguide region $R_1$, and thus, an increase in the voltage at the time of injection of current in the waveguide region $R_1$ can be suppressed.

Furthermore, with the semiconductor laser device 600 having the present configuration, the width of the waveguide region $R_1$ at the emission direction front facet $S_f$ and the width of the waveguide region $R_1$ at the emission direction rear facet $S_b$ are substantially the same width $W_b$, and thus, tolerance to manufacturing error, traceability, and manageability at the time of cutting out each semiconductor laser device from the semiconductor wafer are improved.

Seventh Embodiment

Figure 12:
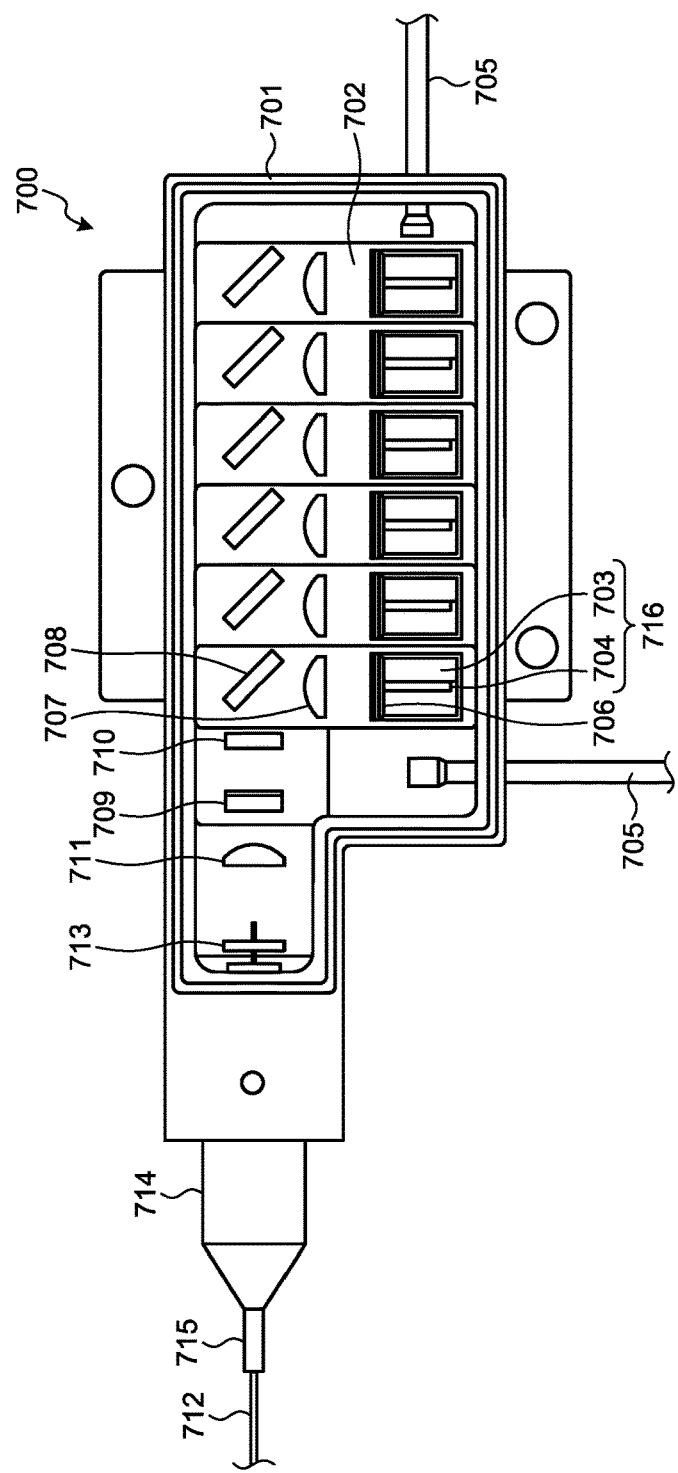
FIG. 12 is a plan view of a semiconductor laser module according to a seventh embodiment.
Figure 13:
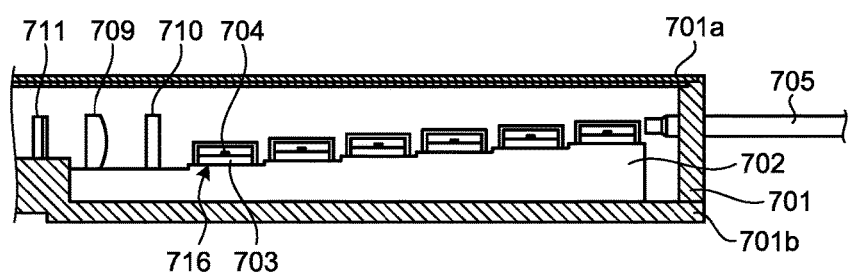
FIG. 13 is a partially cut-out side view of the semiconductor laser module according to the seventh embodiment.

An embodiment of a semiconductor laser module using the semiconductor laser devices according to the first to the sixth embodiments described above will now be described. FIG. 12 is a plan view of a semiconductor laser module according to a seventh embodiment, and FIG. 13 is a partially cut-out side view of the semiconductor laser module according to the seventh embodiment.

A semiconductor laser module 700 includes a metal housing 701; an LD height adjustment plate 702; six cuboid-shaped submounts 703; and six substantially cuboid-shaped semiconductor laser devices 704 as semiconductor devices. The metal housing 701 includes a lid 701a and a bottom plate portion 701b. The LD height adjustment plate 702 is a stair-shaped base and made of metal. The LD height adjustment plate 702, the submounts 703, and the semiconductor laser devices 704 are mounted in this order on the bottom plate portion 701b. Additionally, in FIG. 12, illustration of the lid 701a is omitted for the sake of description.

The housing 701 and the LD height adjustment plate 702 are made of copper (Cu), and function also as a heat sink for radiating heat generated by the semiconductor laser device 704. A coefficient of thermal expansion of Cu is $17 \times 10^{-6}$ (1/K). Additionally, the housing 701 and the LD height adjustment plate 702 may alternatively be made of iron (Fe). A coefficient of thermal expansion of Fe is $12 \times 10^{-6}$ (1/K). Moreover, a thickness of the bottom plate portion 701b is, but not limited to, about 1 mm to 5 mm, and a thickness of the LD height adjustment plate 702 is, but not limited to, about 1 mm to 10 mm.

Furthermore, the semiconductor laser module 700 includes two lead pins 705 electrically connected to each of the semiconductor laser devices 704 via the submount 703 and a bonding wire, not illustrated, to supply power to each of the semiconductor laser devices 704. Moreover, the semiconductor laser module 700 includes six first lens 706, six second lenses 707, six mirrors 708, a diffraction grating 710, a third lens 709, and a fourth lens 711. The diffraction grating 710 is for fixing an emission wavelength of the semiconductor laser devices 704, and a volume Bragg grating (VBG) or a volume holographic grating (VHG) may be used, for example.

The first lenses 706, the second lenses 707, the mirrors 708, the diffraction grating 710, the third lens 709, and the fourth lens 711 are arranged on an optical path of laser light output by each of the semiconductor laser devices 704, in such an order along the optical path. Furthermore, the semiconductor laser module 700 includes an optical fiber 712 arranged facing the fourth lens 711. One end of the optical fiber 712 where the laser light enters is housed inside the housing 701, and is supported by a support member 713. Additionally, as the optical fiber 712, a multi-mode optical fiber supporting a plurality of propagation modes is used.

Each of the semiconductor laser devices 704 has the same configuration as the semiconductor laser devices according to the first to the sixth embodiments described above, and is made by using gallium arsenide (GaAs) or indium phosphide (InP) as a main material, for example. Additionally, a coefficient of thermal expansion of GaAs is $5.9 \times 10^{-6}$ (1/K), and a coefficient of thermal expansion of InP is $4.5 \times 10^{-6}$ (1/K). A thickness of each of the semiconductor laser devices 704 is about 0.1 mm, for example. As illustrated in FIG. 13, the semiconductor laser devices 704 are fixed to the corresponding submounts 703, and the submounts 703 are fixed to the LD height adjustment plate 702 at different elevations. Furthermore, each first lens 706, each second lens 707, and each mirror 708 are arranged at elevations according to the corresponding semiconductor laser devices 704. A structural component including the submount 703 and the semiconductor laser device 704 fixed to the submount 703 will be referred to as a chip on submount 716 as a semiconductor device mounting submount.

Furthermore, a loose tube 715 is provided at an insertion portion for the optical fiber 712 into the housing 701, and a boot 714 is fitted to a part of the housing 701 so as to cover a part of the loose tube 715 and the insertion portion.

Operation of the semiconductor laser module 700 will be described. Power is supplied to each semiconductor laser device 704 via the lead pins 705, with the submount 703 as a supply path, and the semiconductor laser device 704 outputs laser light. Laser light beams output from the corresponding semiconductor laser devices 704 are made substantially collimated light by the corresponding first lenses 706 and second lenses 707, and are reflected toward the third lens 709 by the corresponding mirrors 708. Moreover, each of the laser light beams is condensed by the third lens 709 and the fourth lens 711, and enters an edge of the optical fiber 712 and propagates through the optical fiber 712. That is, the first lens 706, the second lens 707, the mirror 708, the third lens 709, and the fourth lens 711 are an optical system for coupling laser light radiated by the semiconductor laser device 704 into the optical fiber, and such an optical system is provided in the semiconductor laser module 700.

Verification of Effects

The suppression effect, of the semiconductor laser device according to the embodiment described above, on the radiation angle of the laser light radiated from the emission direction front facet $S_f$ will now be described.

Figure 14:
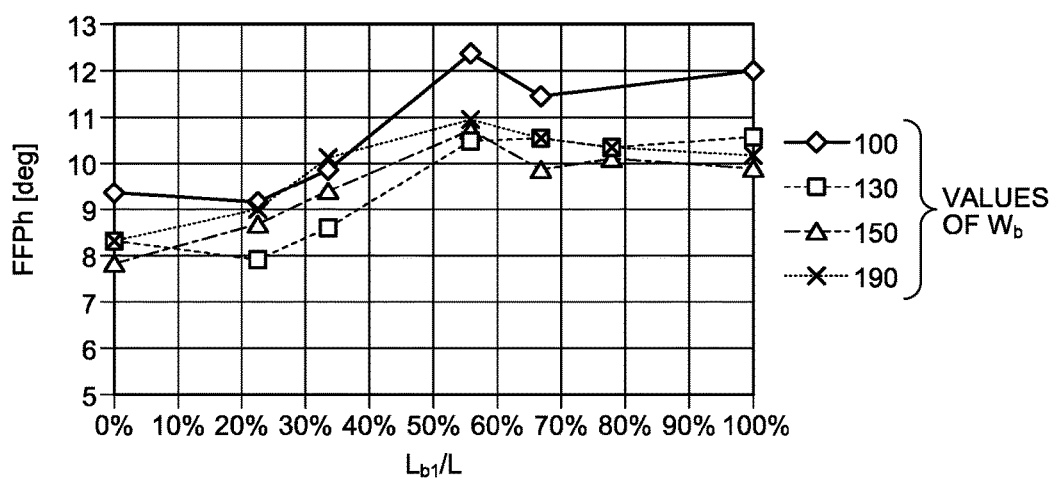
FIG. 14 is a diagram illustrating a graph of a proportion of length $L_{b1}$ to length L and FFPh.

FIG. 14 is a diagram illustrating a graph of FFPh and a proportion of the length $L_{b1}$ to the length L. Experimental data illustrated by the graph in FIG. 14 is acquired by using the semiconductor laser device 200 according to the second embodiment, and parameters of the semiconductor laser device 200 are as follows.

Width $W_b$=100 μm, 130 μm, 150 μm, 190 μm (four experimental samples)

Width $W_n$=50 μm (this and following parameters are common to the four experimental samples)

Width of current injection region $R_2$=width of waveguide region $R_1$−10 μm (Narrowed equally by 5 μm from both ends of waveguide region)

Ratio of length $L_n/L$=0.22%

Ratio of length $L_{t2}/L$=0.89%

Ratio of length $L_{b2}/L$=0.22%

Emission wavelength=900 nm to 1080 nm

Reflectivity of emission direction front facet=0.1% to 7%

Reflectivity of emission direction rear facet=95%

Optical output from emission direction front facet=8 W or more

Material of semiconductor substrate: GaAs

Material of quantum well layer: InGaAs

On a horizontal axis in the graph, "$L_{b1}/L$" is a ratio of the length $L_{b1}$. of the range, on the emission direction front side, where the width $W_b$ of the waveguide region $R_1$ is constant to the total length L of the semiconductor laser device 200. Additionally, the length $L_{t1}$ is defined as length obtained by subtracting the lengths $L_n$, $L_{t2}$, $L_{b1}$, and $L_{b2}$ from the total length L. If $L_{b1}/L$=100%, a straight waveguide where the width $W_b$ is constant across the total length L is indicated, and the lengths $L_n$, $L_{t2}$, $L_{b2}$ in this case is assumed to be zero.

Furthermore, on a vertical axis in the graph, "FFPh" is a far field pattern in the horizontal direction, and indicates a divergence angle, in the horizontal direction, of the laser light radiated from an emission facet, and a total width at a position of $1/e^2$ where driving is performed at a current value 14 A is measured.

As can be read from the graph in FIG. 14, in the case where the length $L_{b1}$ is 56% or less of the total length L of the semiconductor laser device 200, an FFPh reduction effect can be achieved. In other words, if the length $L_{b1}$ is too long, this results in a shape similar to that of a straight waveguide, and the FFPh reduction effect is reduced. Moreover, if the length $L_{b1}$ is less than 20% of the total length L, the FFPh reduction effect is saturated. If the $L_{b1}$ is too short, electrical resistivity is increased. Accordingly, $L_{b1}$ is preferably 20% or more and 56% or less of the total length L.

Furthermore, as can be read from the graph in FIG. 14, the tendency of the relationship between $L_{b1}/L$ and FFPh is the same among the four experimental samples with different widths $W_b$. It should be noted here that the width $W_n$ is the same for the four experimental samples, and that the same tendency is found even when an angle of change from the width $W_n$ to the width $W_b$ is different. This means that the shape of the waveguide region $R_1$ does not greatly affect the FFPh, and that presence of a part where the width of the waveguide region $R_1$ is $W_n$ greatly contributes to the FFPh reduction effect. That is, a principle is confirmed by the experiment that, with the semiconductor laser device according to the embodiment, because the width of the waveguide region $R_1$ is narrowed, as described above, the number of higher order modes is appropriately suppressed, and the suppression effect on the radiation angle of the laser light radiated from the emission direction front facet is achieved.

Figure 15:
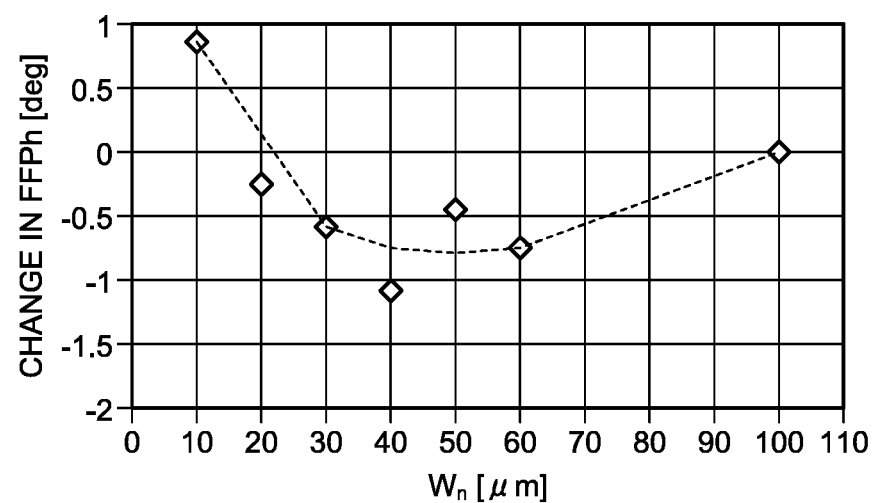
FIG. 15 is a diagram illustrating a graph of width $W_n$ and a change in FFPh.

FIG. 15 is a diagram illustrating a graph of the width $W_n$ and a change in the FFPh. As in the case of the experiment in FIG. 14, experimental data illustrated by the graph in FIG. 15 is obtained by using the semiconductor laser device 200 according to the second embodiment, and in this experiment, a change in the FFPh where the width $W_b$ is fixed at 100 μm and the width $W_n$ is changed is studied. A change in the FFPh means a difference to the straight waveguide (corresponding to $W_n$=100 μm). Moreover, the current value is 6 A.

As can be read from the graph illustrated in FIG. 15, in a range where the width $W_n$ is narrower than 30 μm, the FFPh tends to be more increased when the width $W_n$ is more reduced. This is because, when the width $W_n$ is narrow, the area of the current injection region becomes small, and electrical resistivity of the semiconductor laser is increased, and this results in increased heat generation at the semiconductor laser device. When heat generation is increased, the refractive index of the waveguide region is increased, and the FFPh is increased. A multi-mode semiconductor laser device such as the semiconductor laser device according to the present embodiment is assumed to be used in processing such as welding, and thus, in the present experiment, an extremely large value of 6 A is used. Accordingly, if the electrical resistivity is unnecessarily increased even by a small amount, this may result in big heat generation, and the FFPh reduction effect is negated.

On the other hand, in a range where the width $W_n$ is 30 μm or more, an influence of an increase in resistivity is small, and a desirable FFPh reduction effect is achieved. From the graph illustrated in FIG. 15, an effect amounting to −0.5 degrees is seen in a range where the width $W_n$ is between 30 μm to 75 μm, and particularly desirable reduction in the FFPh is recognized. A lower limit value of the width $W_n$ where an influence of heat starts to become noticeable is different depending on the value of the width $W_b$. What is ultimately important is the area of the current injection region $R_2$.

Additionally, to achieve a desirable FFPh reduction effect, the width $W_n$ is preferably 90 μm or less. This is because if the width $W_n$ exceeds 90 μm, the shape becomes substantially the same as that of a straight waveguide, and superiority over the straight waveguide becomes difficult to achieve.

Figure 16:
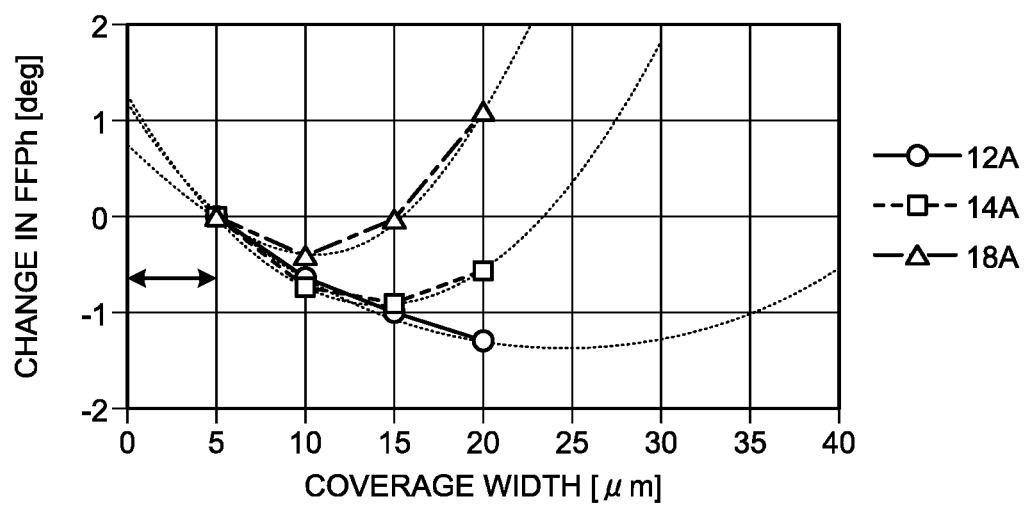
FIG. 16 is a diagram illustrating a graph of a coverage width and a change in FFPh.

FIG. 16 is a diagram illustrating a graph of a coverage width and a change in FFPh. Experimental data illustrated by the graph in FIG. 16 is acquired by using the semiconductor laser device 500 according to the fifth embodiment, and parameters of the semiconductor laser device 500 are as follows.

Waveguide width $W_b$=150 μm (constant across entire length)

Emission wavelength=900 nm to 1080 nm

Reflectivity of emission direction front facet=0.1% to 7%

Reflectivity of emission direction rear facet=95%

Optical output from emission direction front facet=8 W or more

Material of semiconductor substrate: GaAs

Material of quantum well layer: InGaAs

Driving current=12, 14, 18 A (3 patterns)

On a horizontal axis in the graph, "coverage width" is a value obtained by dividing, by two, a result of subtracting the width of the current injection region in the horizontal direction from the width of the waveguide region in the horizontal direction, as described above.

Furthermore, on a vertical axis in the graph, "FFPh" is a far field pattern in the horizontal direction, and indicates a divergence angle, in the horizontal direction, of the laser light radiated from an emission facet, and a total width at a position of $1/e^2$ is measured. A change in the FFPh means a difference with respect to a case where the coverage width is 5 μm. As described above, the coverage width of the conventional semiconductor laser device is greater than 0 μm and 5 μm or less (range indicated by an arrow in the drawing), but in this case, a case where the coverage width is 5 μm is used as a reference.

Additionally, dotted lines in the graph are obtained by fitting quadratic curves to the experimental data.

As can be read from the graph illustrated in FIG. 16, at each current value, when the coverage width is increased, the FFPh is reduced. On the other hand, if the coverage width is too increased, voltage to be applied is increased, and the FFPh tends to be increased due to heat generation. Furthermore, when the driving current is increased, the FFPh starts to be increased from a stage where the coverage width is relatively narrow, due to heat generation by the driving current.

A driving current 14 A is a driving current sufficient to obtain optical output of about 13 W. At the driving current 14 A, the coverage width is 23 µm or less, and the FFPh is at or less than the FFPh of the conventional example (value on the vertical axis in the graph is zero or less). At a driving current 18 A corresponding to a case where high power is required, the coverage width is 15 µm or less, and the FFPh is at or less than the FFPh of the conventional example (value on the vertical axis in the graph is zero or less).

From these results, it can be grasped that the coverage width is preferably 23 µm or less, and more preferably 15 µm or less. Moreover, when considered with respect to the width of the waveguide region, the coverage width $W_c$ is preferably 15.3% or less, or more preferably 10% or less, of the width of the waveguide region $R_1$.

The present disclosure is described above with reference to the embodiments, but the present disclosure is not limited to the embodiments. For example, the waveguide of the semiconductor laser devices according to the embodiments described above adopt a ridge structure, but this is not restrictive, and waveguide structures such as a self-aligned structure (SAS structure) and a buried-hetero structure (BH structure) may also be adopted. Furthermore, a technique of forming the waveguide by quantum well intermixing may be adopted. The embodiments described above describe examples of a semiconductor laser device of a refractive index waveguide type, but the present disclosure may be applied to a semiconductor laser of a gain waveguide type, without being limited to the refractive index waveguide type. Moreover, in the case of a waveguide of the ridge structure, the same waveguide function is obtained even if a part of a semiconductor layer, outside the ridge structure, is at approximately the same height as the ridge structure.

According to a semiconductor laser device, a chip on submount, and a semiconductor laser module according to the present disclosure, a radiation angle of laser light radiated from a facet may be reduced.

What is claimed is:

1. A semiconductor laser device of an edge emission type, the semiconductor laser device comprising:
    a multi-mode waveguide;
    a first facet of the multi-mode waveguide on an emission direction front side, the first facet having a first width in a horizontal direction perpendicular to a longitudinal direction of the multi-mode waveguide; and
    a second facet of the multi-mode waveguide on an emission direction rear side, the second facet having the first width, wherein
    a width of the multi-mode waveguide, in the horizontal direction, is at least partially narrower than the first width, in a region between the first facet and the second facet,
    the region between the first facet and the second facet is 80% or less of a total length of the multi-mode waveguide, and a length of the fist facet is equal to or longer than a processing accuracy length at a time of cutting the emission direction front side,
    a length of the second facet is at least 5 µm and longer than a processing accuracy at a time of cleaving the emission direction rear side, and
    a width of the first facet at the emission direction front facet and the width of the second facet at the emission direction rear side are substantially the same.

2. The semiconductor laser device according to claim 1, wherein a narrowest width of the multi-mode waveguide between the first facet on the emission direction front side and the second facet on the emission direction rear side is 30 µm or more and 75 µm or less.

3. The semiconductor laser device according to claim 1, further comprising a current injection region from which current is injected into the multi-mode waveguide, the current injection region having a width, in the horizontal direction, that is at least partially narrower, between the first facet on the emission direction front side and the second facet on the emission direction rear side, than a width, in the horizontal direction, of the current injection region on the emission direction front side.

4. The semiconductor laser device according to claim 3, further comprising a current non-injection region where the current injection region is not formed, the current non-injection region being provided on the emission direction front side or the emission direction rear side.

5. A semiconductor laser device of an edge emission type, the semiconductor laser device comprising:
    a multi-mode waveguide;
    a first facet of the multi-mode waveguide on an emission direction front side, the first facet having a first width in a horizontal direction perpendicular to a longitudinal direction of the multi-mode waveguide; and
    a second facet of the multi-mode waveguide on an emission direction rear side, the second facet having the first width; and
    a current injection region from which current is injected into the multi-mode waveguide, the current injection region having a width, in the horizontal direction, that is at least partially narrower, in a region between the first facet on an emission direction front side and the second facet on an emission direction rear side, than a width, in the horizontal direction, of another region of the current injection region,
    wherein the region between the first facet and the second facet is 80% or less of a total length of the multi-mode waveguide, and a length of the fist facet is equal to or longer than a processing accuracy length at a time of cutting the emission direction front side,
    a length of the second facet is at least 5 µm and longer than a processing accuracy at a time of cleaving the emission direction rear side, and
    a width of the first facet at the emission direction front facet and the width of the second facet at the emission direction rear side are substantially the same.

6. The semiconductor laser device according to claim 5, further comprising a current non-injection region where the current injection region is not formed, the current non-injection region being provided on the emission direction front side or the emission direction rear side.

7. A semiconductor laser device of an edge emission type, the semiconductor laser device comprising:
    a multi-mode waveguide;
    a current injection region from which current is injected into the multi-mode waveguide, the current injection region having a width narrower than the multi-mode waveguide in a horizontal direction perpendicular to a longitudinal direction of the multi-mode waveguide, the current injection region being 80% or less of a total length of the multi-mode waveguide, portions of the multi-mode waveguide other than the current injection region being a same width; and
    a coverage region having a coverage width obtained by dividing, by two, a result of subtracting the width of the current injection region from a width of the multi-mode waveguide in the horizontal direction, the coverage width being at least partially wider than 5 µm, between a first facet of the multi-mode waveguide on an emission direction front side and a second facet of the multi-mode waveguide on an emission direction rear side.

8. The semiconductor laser device according to claim 7, wherein the coverage width is 15 µm or less.

9. The semiconductor laser device according to claim 7, wherein the coverage width is 15.3% or less of the width of the multi-mode waveguide.

10. The semiconductor laser device according to claim 7, wherein the coverage width is 10% or less of the width of the multi-mode waveguide.

11. A chip on submount comprising:
the semiconductor laser device according to claim 1; and
a mount being electrically conductive, wherein the semiconductor laser device is placed on the mount.

12. A chip on submount comprising:
the semiconductor laser device according to claim 5; and
a mount being electrically conductive, wherein the semiconductor laser device is placed on the mount.

13. A chip on submount comprising:
the semiconductor laser device according to claim 7; and
a mount being electrically conductive, wherein the semiconductor laser device is placed on the mount.

14. A semiconductor laser module comprising:
the chip on submount according to claim 11; and
at least one lens provided in an optical path between the semiconductor laser device and an optical fiber, thereby to couple the laser light radiated by the semiconductor laser device into the optical fiber.

15. A semiconductor laser module comprising:
the chip on submount according to claim 12; and
at least one lens provided in an optical path between the semiconductor laser device and an optical fiber, thereby to couple the laser light radiated by the semiconductor laser device into the optical fiber.

16. A semiconductor laser module comprising:
the chip on submount according to claim 13; and
at least one lens provided in an optical path between the semiconductor laser device and an optical fiber, thereby to couple the laser light radiated by the semiconductor laser device into the optical fiber.

17. The semiconductor laser module according to claim 14, further comprising a diffraction grating fixing an emission wavelength of the semiconductor laser device, at an intermediate portion of the optical path from the semiconductor laser device to the optical fiber.

18. The semiconductor laser module according to claim 15, further comprising a diffraction grating fixing an emission wavelength of the semiconductor laser device, at an intermediate portion of an optical path from the semiconductor laser device to the optical fiber.

19. The semiconductor laser module according to claim 16, further comprising a diffraction grating fixing an emission wavelength of the semiconductor laser device, at an intermediate portion of an optical path from the semiconductor laser device to the optical fiber.

20. The semiconductor laser device according to claim 7, wherein the coverage width is 23 µm or less.

* * * * *